(12) United States Patent
Ismail et al.

(10) Patent No.: US 11,022,633 B2
(45) Date of Patent: Jun. 1, 2021

(54) ENHANCED SYSTEM AND METHOD FOR CONDUCTING PCA ANALYSIS ON DATA SIGNALS

(71) Applicant: MCMASTER UNIVERSITY, Hamilton (CA)

(72) Inventors: Mahmoud Ismail, Mississauga (CA); Saeid Habibi, Stoney Creek (CA); Samir Ziada, Hamilton (CA)

(73) Assignee: McMaster University, Hamilton (CA)

( * ) Notice: Subject to any disclaimer, the term of this patent is extended or adjusted under 35 U.S.C. 154(b) by 394 days.

(21) Appl. No.: 15/499,973

(22) Filed: Apr. 28, 2017

(65) Prior Publication Data

US 2017/0356936 A1    Dec. 14, 2017

Related U.S. Application Data

(60) Provisional application No. 62/334,532, filed on May 11, 2016.

(51) Int. Cl.
| | | |
|---|---|---|
| G01R 19/00 | (2006.01) | |
| G06K 9/00 | (2006.01) | |
| G06K 9/62 | (2006.01) | |
| G01M 13/04 | (2019.01) | |
| G01M 13/045 | (2019.01) | |
| G01M 99/00 | (2011.01) | |

(52) U.S. Cl.
CPC ......... *G01R 19/0053* (2013.01); *G01M 13/04* (2013.01); *G01M 13/045* (2013.01); *G01M 99/005* (2013.01); *G01M 99/008* (2013.01); *G06K 9/0051* (2013.01); *G06K 9/00523* (2013.01); *G06K 9/6247* (2013.01)

(58) Field of Classification Search
CPC .. G01M 99/008; G01M 13/04; G01M 99/005; G01M 13/045; G01R 19/0053; G06K 9/00523; G06K 9/6247; G06K 9/0051
See application file for complete search history.

(56) References Cited

U.S. PATENT DOCUMENTS

| | | | |
|---|---|---|---|
| 6,727,725 B2 | 4/2004 | Devaney et al. | |
| 8,676,538 B2 | 3/2014 | Purdy | |
| 8,805,111 B2 * | 8/2014 | Chaudhuri | ................ G06T 5/50 382/260 |
| 9,314,181 B2 * | 4/2016 | Brockway | .......... A61B 5/02028 |

(Continued)

FOREIGN PATENT DOCUMENTS

EP    2950177 A1    1/2000

OTHER PUBLICATIONS

Kurita et al, "Logistic Discriminant Analysis" Proceedings of the 2009 IEEE International Conference on Systems, Man, and Cybernetics San Antonio, TX, USA—Oct. 2009 (Year: 2009).*

(Continued)

*Primary Examiner* — Stephanie E Bloss
(74) *Attorney, Agent, or Firm* — Brion Raffoul

(57) ABSTRACT

Systems and methods relating to fault detection and diagnosis. Signals received from sensors are first filtered to remove noise and are then analyzed using wavelet packet transform (WPT) based PCA. The results of the PCA analysis are then automatically classified to thereby quickly and easily determine what issues there may be in a finished product or in a machine being monitored.

19 Claims, 30 Drawing Sheets

(56) References Cited

U.S. PATENT DOCUMENTS

| | | | | |
|---|---|---|---|---|
| 2002/0169569 | A1* | 11/2002 | Miller | G01M 13/045 702/56 |
| 2003/0171899 | A1* | 9/2003 | Castellane | G01N 21/94 702/189 |
| 2005/0284225 | A1* | 12/2005 | Luo | F03D 15/10 73/593 |
| 2006/0095232 | A1* | 5/2006 | Purdy | G05B 23/0221 702/185 |
| 2009/0270713 | A1* | 10/2009 | Kimura | A61B 5/4362 600/411 |
| 2010/0030492 | A1* | 2/2010 | Kar | F16C 19/52 702/39 |
| 2010/0114813 | A1* | 5/2010 | Zalay | A61B 5/048 706/58 |
| 2012/0116722 | A1* | 5/2012 | Yousfi-Steiner | G06K 9/00536 702/185 |
| 2012/0296512 | A1* | 11/2012 | Lee | B60W 50/14 701/29.3 |
| 2013/0024164 | A1* | 1/2013 | Paajarvi | G01M 13/045 702/194 |
| 2014/0182350 | A1* | 7/2014 | Bhavaraju | A61B 5/1495 73/1.02 |
| 2015/0233792 | A1* | 8/2015 | Gao | G01M 99/005 702/35 |
| 2015/0346066 | A1* | 12/2015 | Dutta | G01M 99/008 702/183 |

OTHER PUBLICATIONS

Cao, W. et al., "A remote sensing image fusion method based on PCA transform and wavelet packet transform," Proceedings of the 2003 International Conference on Neural Networks and Signal Processing, vol. 2, pp. 976-981, Dec. 14-17, 2003 (Year: 2003).*

Yang, H. et al. "Vibration feature extraction techniques for fault diagnosis of rotating machinery: a literature survey" 2003.

Ghorbanian, V., et al., "A survey on time and frequency characteristics of induction motors with broken rotor bars in line-start and inverter-fed modes",(2015).

Bakshi, B.R., "Multiscale PCA with application to multivariate statistical process monitoring", (1998).

Bendjama, H., et al., "Fault Diagnosis of Rotating Machinery Using Wavelet Transform and Principal Component Analysis",(2010).

Haqshenas, S. R., "Multiresolution-Multivariate Analysis of Vibration Signals; Application in Fault Diagnosis of Internal Combustion Engines",(2013).

Boll, S. F., "Suppression of acoustic noise in speech using spectral subtraction",(1979).

Lim, J. S., et al., "Enhancement and bandwidth compression of noisy speech",(1979).

Hodgson, J., "Understanding Records: A Field Guide to Recording Practice", pp. 86-87(2010).

Martinek, R., et al., "Novel signal gate solution suitable for implementation in audio and recording technologies", (2012).

Sawalhi, N., et al. "The enhancement of fault detection and diagnosis in rolling element bearings using minimum entropy deconvolution combined with spectral kurtosis".

P. Paajarvi and J. P. Leblanc, "Method for rolling bearing fault detection based on enhancing statistical asymmetry" (2011).

M. A. Purdy, "Adjusting weighting of a parameter relating to fault detection based on a detected fault" (2014).

P. Dutta, G. C. Keong, S. Nadarajan, F. Yang, X. Zhao and K. Shyh-hao, "Asset condition monitoring" (2015).

M. J. Devaney and L. Eren, "Motor bearing damage detection via wavelet analysis of the starting current transient" (2004).

* cited by examiner

TABLE 1

Table 1 DWT bandwidths for three level decomposition

| Level | Frequencies | $\Delta_f$ | Samples |
|---|---|---|---|
| 1 | $\frac{F_s}{4}$ to $\frac{F_s}{2}$ | $\frac{F_s}{4}$ | 64 |
| 2 | $\frac{F_s}{8}$ to $\frac{F_s}{4}$ | $\frac{F_s}{8}$ | 32 |
| 3 | $\frac{F_s}{16}$ to $\frac{F_s}{8}$ | $\frac{F_s}{16}$ | 16 |
| 3 | $0$ to $\frac{F_s}{16}$ | $\frac{F_s}{16}$ | 16 |

FIG. 26

ENHANCED SYSTEM AND METHOD FOR CONDUCTING PCA ANALYSIS ON DATA SIGNALS

RELATED APPLICATIONS

This application is a non-provisional patent application which claims the benefit of U.S. Provisional Application No. 62/334,532 filed on May 11, 2016.

TECHNICAL FIELD

The present application pertains generally to the field of condition monitoring. More specifically, the present application relates to fault detection and diagnosis.

BACKGROUND

Fault detection and diagnosis (FDD) can be used for End of Line Testing (EOL). In EOL testers, the purpose is to test the manufactured products as a quality control measure. If the product passes the test, it is processed and prepared for shipment. If the product fails the test, the product is withheld from shipment. Industry favours not only the detection of faults but also the troubleshooting for the root cause of that fault. Industry therefore favours the performance of fault diagnosis/isolation.

Fault diagnosis/isolation is important to identify and correct the root cause of the problem as fast as possible and to thereby reduce manufacturing costs. In industry, rotational components such as electric motors are very commonly used, and, since these components are prone to manufacturing issues, robust quality control measures are required. For this reason, manufacturers use Fault Detection and Diagnosis (FDD) systems installed on EOL testers to perform the required fault detection and analysis.

Industrial FDD applications are subject to stringent requirements. These requirements vary from timing restrictions, robustness, to environmental disturbances, accuracy, and ease of use for operators. The timing restriction is particularly pronounced in real-time applications and in production lines. The manufacturing environment also contains undesired disturbances and noise that affects FDD systems and its testing, especially if sound and vibrations are measurements used to detect and diagnose manufacturing faults. These disturbances can alter the test results if they are not filtered out. Lastly, FDD testers are usually operated by manufacturing line workers. As such, manufacturers prefer FDD testers to be very easy to use in order to eliminate any need for highly qualified, trained technical personnel to operate these testers.

The concept of FDD in EOL testers can be extended and applied to the field of monitoring machine health. In machine health monitoring, the FDD system is run continuously on the same machine instead of running it once per product in the case of EOL testers. However, regardless of this difference, the underlying FDD tool used is exactly the same in both applications.

One practical example of where FDD technology would be useful would be in the field of automotive starters and alternators. In the industry relating to automotive starters and alternators, parts are usually given only a few seconds to be tested due to the high throughput of manufacturing. Automotive starters and alternators can suffer from both low and high frequency faults. Preferably, an FDD system should be able to detect both types of faults robustly in noisy environments. Also preferably, any FDD system should also be able to display a clear readable result that an operator can use without the need for FDD technical training.

Current FDD methods vary from the simple to the complex. The most basic methods used in industry involve simple measurements of such physical manifestations as vibration or sound. Such methods evaluate vibration and sound Root Mean Square (RMS) values for an arbitrary period of time. Slightly more complex systems utilize more statistical measures such as Peak-To-Peak levels, Crest Factor, Kurtosis, and skewness in the measured variables. An example of using kurtosis is shown by Sawalhi, N., et al., "The enhancement of fault detection and diagnosis in rolling element bearings using minimum entropy deconvolution combined with spectral kurtosis", (2007). Another temporal signal example is shown in the patent publication US20130024164 by Paajarvi, P., et al., "Method for rolling bearing fault detection based on enhancing statistical asymmetry". In this publication, a linear filter is used to filter and differentiate ball bearing impulses from noise.

The above methods are all based on time signals (temporal methods) and they analyze one signal at a time. Usually, signals that measure phenomena such as sound and vibration acquire the same events that occur when testing a part. This includes events such as, for example, ball bearing failures. Preferably, to maximize fault detection and isolation performance, different signals are analyzed simultaneously. Multiple signals analyzed simultaneously gives rise to the use of multivariate analysis and, in this field, Principal Components Analysis (PCA) is commonly used for such analyses. PCA models the correlation structure between different signals and thus acknowledges the shared information content between different signals. Numerous references (both patent publications and academic papers) use PCA for FDD due to FDD's efficiency and abilities. In one example, U.S. Pat. No. 8,676,538 by Purdy, M. A. ("Adjusting weighting of a parameter relating to fault detection based on a detected fault"), PCA is used in a dynamic weighting technique for performing fault detection. This reference discusses application of PCA in semiconductors and explains how PCA can be used to improve fault detection reliability through a feedback system. In patent publication EP2950177A1, Dutta, P., et al. ("Asset condition monitoring"), a machine monitoring application uses PCA and uses information gathered through different sensors. In this reference, PCA is used as for feature extraction as well as a dimensional reduction method alongside, in parallel, a preprocessor and a classifier. The results from the parallel branches are compared with the known faults.

The above noted methods analyze measurements in a temporal form. However, in many cases it is known that faults can be detected and isolated by the inspection of a signal's frequency content. In Yang, H., et al., "Vibration feature extraction techniques for fault diagnosis of rotating machinery: a literature survey", (2003), Yang shows different types of temporal and frequency domain based FDD systems. Frequency domain systems start from simple spectrum methods, as shown in Ghorbanian, V., et al., "A survey on time and frequency characteristics of induction motors with broken rotor bars in line-start and inverter-fed modes", (2015). In this reference, it is shown that broken bar faults in motors cause different peaks in the spectrum of faulty motors. Peak frequencies depend on the slip factor (s), which represents the lag between the magnetic field's speed and the rotor speed.

Similarly to pure temporal methods, spectral methods have been used to analyze a signal in only one domain. A method that analyzes the measured signal in both spectral as well as temporal domains may be used to obtain the benefits of both domains. For that reason, wavelets may be used. In U.S. Pat. No. 6,727,725B2, Devaney, M. J., et al. ("Motor bearing damage detection via wavelet analysis of the starting current transient") wavelets and, specifically, Discrete Wavelet Transform (DWT), were used to detect bearing faults during motor start-up transient measurements.

While wavelets are useful, the issue of maximizing fault information from multiple measurements arises again in frequency/time domain methods, including in methods that use wavelets. To address this issue, Bakshi, B. R., "Multi-scale PCA with application to multivariate statistical process monitoring", (1998) DWT was combined with PCA in a new method called Multi-Scale PCA (MSPCA). In this method, DWT is used to decompose the signal in different frequency bandwidth levels and then PCA analysis is performed on each level to detect faults as shown in FIG. 1. One application of MSPCA is shown in Bendjama, H., et al., "Fault Diagnosis of Rotating Machinery Using Wavelet Transform and Principal Component Analysis", (2010). In this reference, MSPCA is used along with contribution plots to isolate the faults once they are detected using MSPCA. MSPCA is based on PCA for fault detection and therefore depends on comparing the measured signals with a baseline (in-control model) signal. This is notable as a baseline needs to exist for MSPCA to be able to detect faults. The typical steps for MSPCA with Reconstruction Based Contribution (RBC) plots for isolation is as shown in FIG. 2. These steps are described in detail in Haqshenas, S. R., "Multiresolution-Multivariate Analysis of Vibration Signals; Application in Fault Diagnosis of Internal Combustion Engines", (2013).

The above discussion shows that a number of advances in the field of FDD have occurred. However, these current methods have a number of existing limitations. One limitation is in fault frequency detection resolution: DWT decomposes the measured signals at different levels but these levels are not equal in frequency bandwidths. As shown in FIG. 3, the first level detail coefficients bandwidth (D1) is half of the bandwidth for the signals. This causes problems when different faults exhibit themselves in the high frequency bandwidth, as PCA will detect these faults at the same level, making the fault signatures similar. This causes high frequency faults to be inseparable. Another limitation of the current FDD methods occurs when PCA detects faults at different levels. The fault sensitivity varies from one level to another due to wavelets and PCA transformations. This is unfavourable behaviour as it decreases the whole system's accuracy in diagnosing faults across different frequencies.

A third limitation of the current methods is that fault diagnosis and determination using Contribution plots is not very accurate. This lack of accuracy is due to the same reason as the second limitation: if two similar severity faults exist in two measured signals, contribution plots will detect them with different sensitivity, thereby showing one fault having a higher severity over the other. This causes a limitation in diagnosis accuracy.

A fourth limitation relates to the efficiency of the current methods. In systems such as the one used in the above noted patent reference EP2950177A1, Dutta, P., et al., ("Asset condition monitoring"), PCA is performed N times, where N is the number of known conditions. This is not the most efficient design for a complex analysis that uses PCA and wavelets.

A final limitation of current methods is that current systems do not account for normal meandering changes that happen over a long time span in a manufacturing environment. Such changes affect the measurements but are not necessarily related to faults. One example of such changes is humidity. Normal humidity fluctuations have effects on sound measurements and can thereby affect not just the measurements but any analysis based on such measurements.

From the above, there is therefore a need for systems and methods which mitigate if not overcome the limitations and shortcomings of the prior art.

SUMMARY

The present invention provides systems and methods relating to fault detection and diagnosis. Signals received from sensors are first filtered to remove noise and are then analyzed using wavelet packet transform (WPT) based PCA. The results of the PCA analysis are then automatically classified to thereby quickly and easily determine what issues there may be in a finished product or in a machine being monitored.

In one aspect, the present invention provides a signal based fault detection and diagnosis system called Industrial Extended Multi-Scale Principle Components Analysis (IEMSPCA). One implementation of the present invention uses a filtration block, a detection and extraction block, and an automatic classification block. The filtration block filters out background noise while the detection and filtration block uses wavelets, PCA, and statistical indices to detect and extract faults from measured physical signals. The classification block classifies faults detected by the detection and extraction block.

In one implementation, the system combines well known tools, such as wavelets and Principal Components Analysis (PCA) as well as a new statistical index to develop a robust end-To-end fault detection and diagnosis solution for industrial use. The system is further uses a noise filter to boost its robustness in noisy environments. In addition, the system has an automatic classifier to provide easily readable results. This simplifies the user interface and omits the previous need for highly trained technical personnel to operate the system. The classifier also has a self-adapting dynamic feature to cope with meandering changes in manufacturing environments.

The systems and methods of the present invention possess numerous benefits and advantages over traditional and the state-of-the-art Fault Detection and Diagnosis (FDD) methods such as Multi-Scale Principle Components Analysis (MSPCA). In particular, using Wavelet Packet Transform (WPT) instead of Discrete Wavelet Transform (DWT) allows for a finer high frequency resolution. This results in better detection and isolation for high frequency faults. Moreover, introducing a new statistical index allows the fault detection and isolation process to be performed efficiently, thereby reducing the overall FDD processing time. This statistical index produces a unique fault signature per fault type. The use of a unique fault signature allows for the identification of the types of problems existing in a given machine.

The new statistical index noted above is different than what is found in the state-of-the-art statistical methods. This index allows for the detection of faults in different frequency bandwidths evenly. The state-of-the-art statistical methods currently used are more sensitive to faults in some frequency bands over the other, which introduces uncertainty in fault detection. This uncertainty is eliminated by the new statistical processing method. Another advantage to the introduced statistical index is that it detects faults across different input signals evenly. In other words, faults that exist in different input signals are detected with the same sensitivity and therefore result in more robust and accurate fault isolation.

In a first aspect, the present invention provides a system for analyzing signals from at least one sensor, the system comprising:
   a filter module for filtering background noise from data signals to produce filtered signals, said data signals being received from said at least one sensor;
   a PCA analysis module for conducting Principal Components Analysis (PCA) on said filtered signals using a wavelet packet transform (WPT);
   a classifier module for classifying fault results from said PCA analysis module;
wherein said data signals represent physical measurements measured by said at least one sensor.

In a second aspect, the present invention provides a method for analyzing signals from at least one sensor, the method comprising:
   a) filtering background noise from data signals to produce filtered signals, said data signals being received from said at least one sensor;
   b) conducting Principal Components Analysis (PCA) on said filtered signals;
   c) classifying fault results from said PCA analysis module;
wherein said data signals represent physical measurements measured by said at least one sensor and said filtered signals are normalized prior to step b).

BRIEF DESCRIPTION OF THE DRAWINGS

The embodiments of the present invention will now be described by reference to the following figures, in which identical reference numerals in different figures indicate identical elements and in which:

FIG. 26 is a table that shows the bandwidth of each level where $\Delta f$ is the bandwidth of each frequency level.

DETAILED DESCRIPTION

Figure 4:
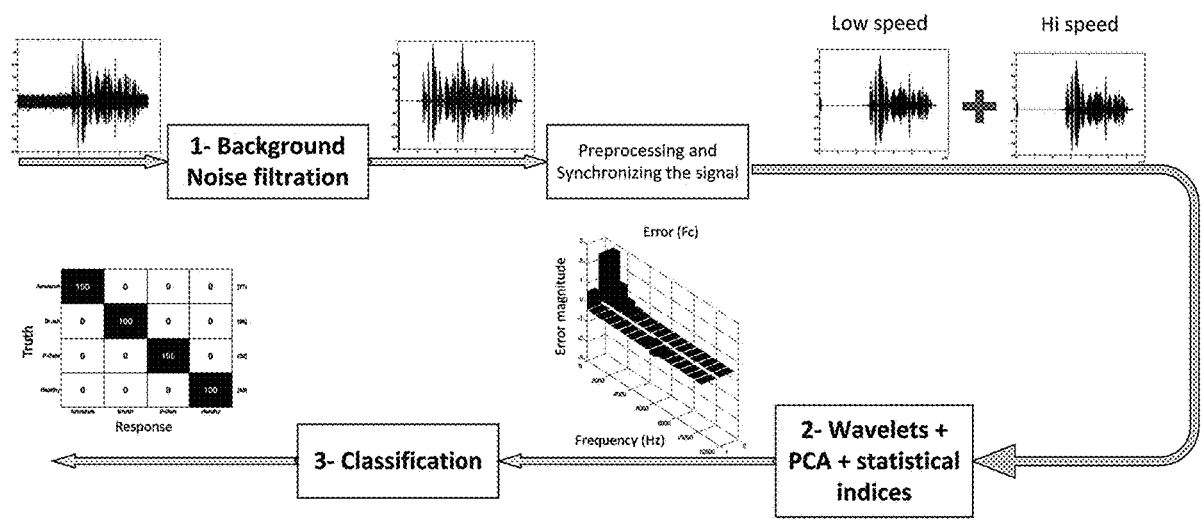
FIG. 4 is a block diagram of a system according to one aspect of the present invention.

In one aspect of the present invention, a block diagram of the inventive FDD system is shown in FIG. 4. The system consists of three main stages: (1) filtration of background noise stage, (2) a stage for the detection and extraction of the fault signatures using wavelets, PCA, and statistical indices, and (3) a stage for the automatic classification of faults. More specifically, the system uses noise gating for the background noise filtration stage, wavelet packet transform (WPT) for the wavelet analysis stage, and a logistic discriminant for the automatic classification stage.

The present invention may be used in industrial applications and, as such, different features may be important such as noise rejection. For some applications, typical industrial environment noise must be rejected and filtered out to avoid its effects on the analysis which can alter the FDD system's results. Another important aspect is the usability of the system. It would therefore be preferable that the system output a simple readable result and it would also be preferable that the system not require highly qualified technical personnel to understand and interpret its results. These preferences have shaped the design of the technology described herein. In one exemplary implementation, the system therefore filters the inputs, extracts existing fault signatures, and translates the detected fault signatures into a readable form. These three steps are shown in FIG. 4.

The first stage of the system, performed in one embodiment by a filter module, is background noise filtration. This field is very well-studied, and, as such, this stage embodies a smart selection for the right method to work seamlessly with the FDD core of the system. In noise filtration, there are two main subcategories for the spectrum based filtration category, (1) spectral subtraction, and (2) spectrum attenuation based methods. Both subcategories take a sample of the noise profile and then filter the main signal. In spectral subtraction, the spectrum of the noise profile is subtracted from the main signal spectrum. This subcategory of noise filtration methods is discussed in details in Boll, S. F., "Suppression of acoustic noise in speech using spectral subtraction", (1979), and in Lim, J. S., et al., "Enhancement and bandwidth compression of noisy speech", (1979). The other subcategory which is used in the system embodying the invention is that of spectrum attenuation methods. In this subcategory the spectrum of the measured signals is attenuated at a chosen set of frequencies. This set of frequencies is found by comparing the signal spectrum with the noise profile spectrum. One of these spectrum attenuation methods is called the Noise Gating method. The Noise Gating concept is explained in Hodgson, J., "Understanding Records: A Field Guide to Recording Practice", (2010). More information about Noise Gating can be found in literature such as in Martinek, R., et al., "Novel signal gate solution suitable for implementation in audio and recording technologies", (2012).

Figure 5:
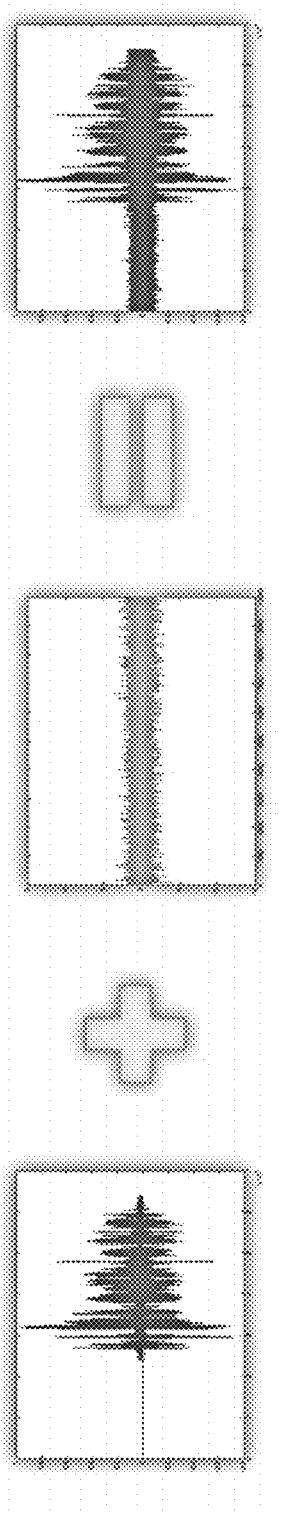
FIG. 5 schematically illustrates the effect of noise on test measurements.

In FIG. 5, an example of the background noise found in sound measurements in industrial environments is shown. The noise gating method filters noise by applying a threshold and, if the real measurement is higher than the background noise, the gate will be open and the output level will be the same as the input level. Otherwise the gate is closed, and the noise is filtered out. An explanation of the gating concept along with Noise Gating features is provided below with reference to FIGS. 6A to 6F.

Figure 6A:
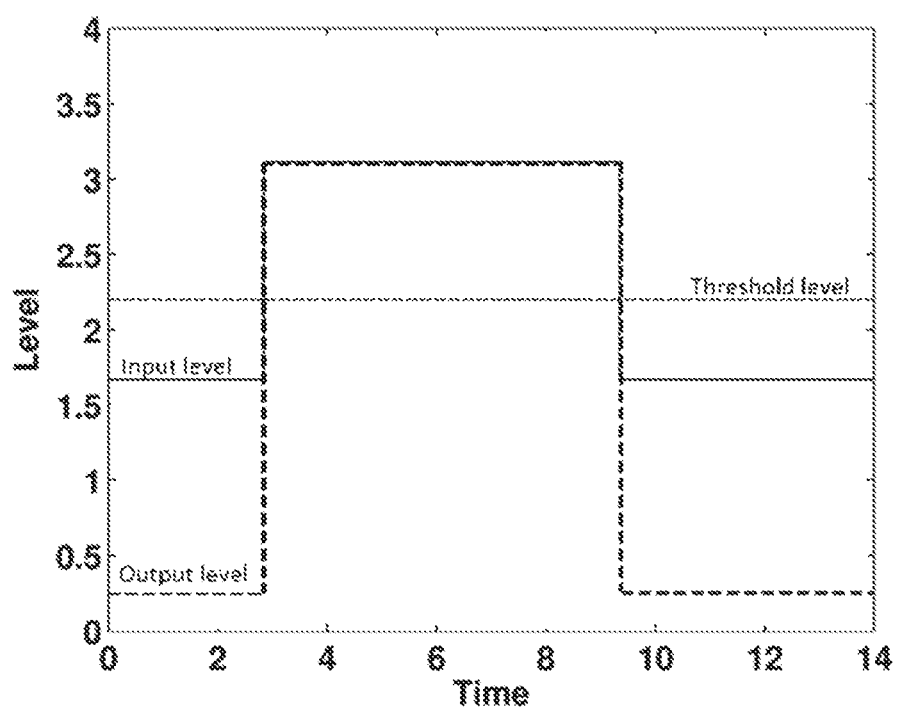
FIGS. 6A-6G illustrates features which may be used with the noise gating method used with the present invention.

Referring to FIG. 6A, the figure shows the basic concept on the Noise Gating. If the input level is below the threshold level, then the output level is the same as the input level. However, if the input level is below the threshold level, then the input is suppressed or not allowed through the gate.

Figure 6B:
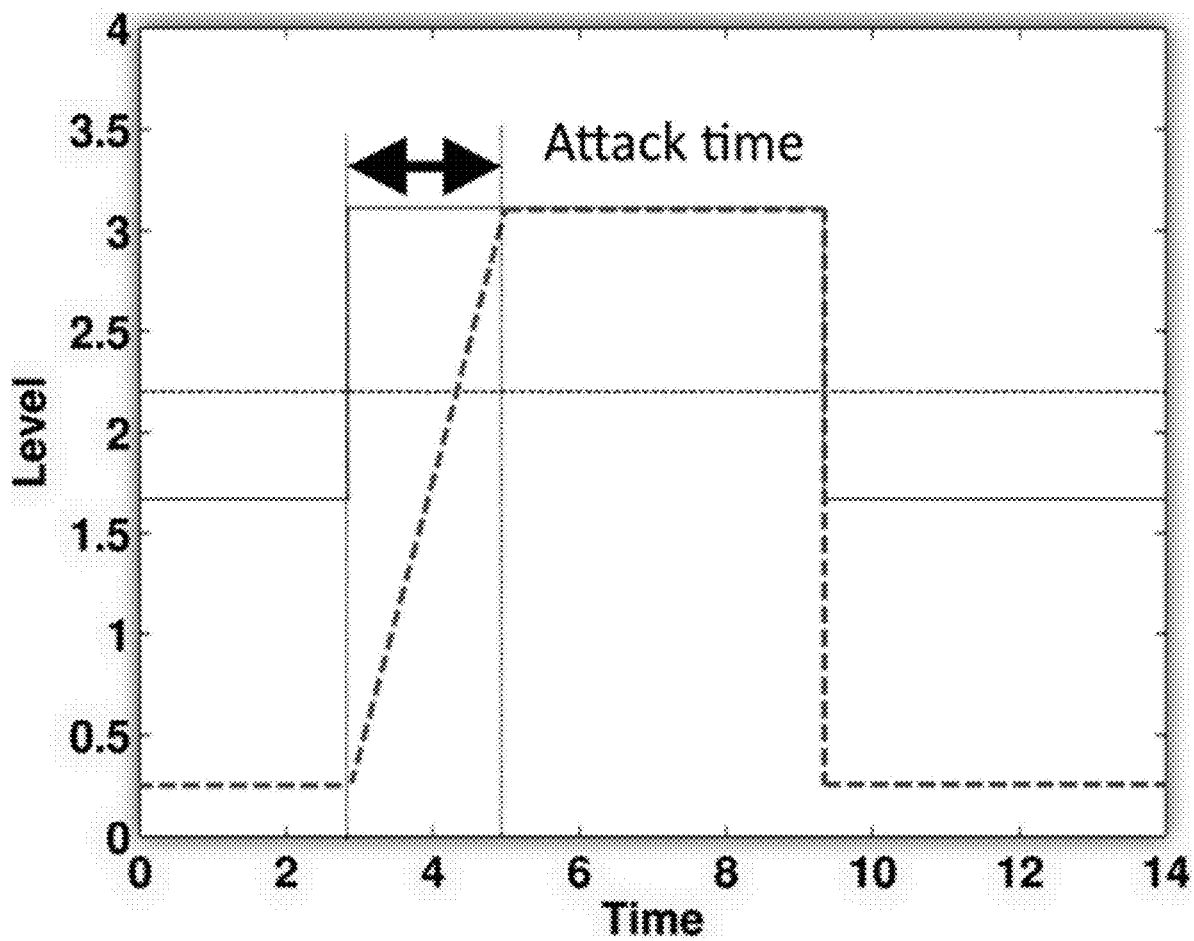

FIG. 6B illustrated the attack time feature the may be used in conjunction with the noise gating method. This feature smoothly opens the gate to avoid any sudden jumps or clicks in the filtered signal.

Figure 6C:
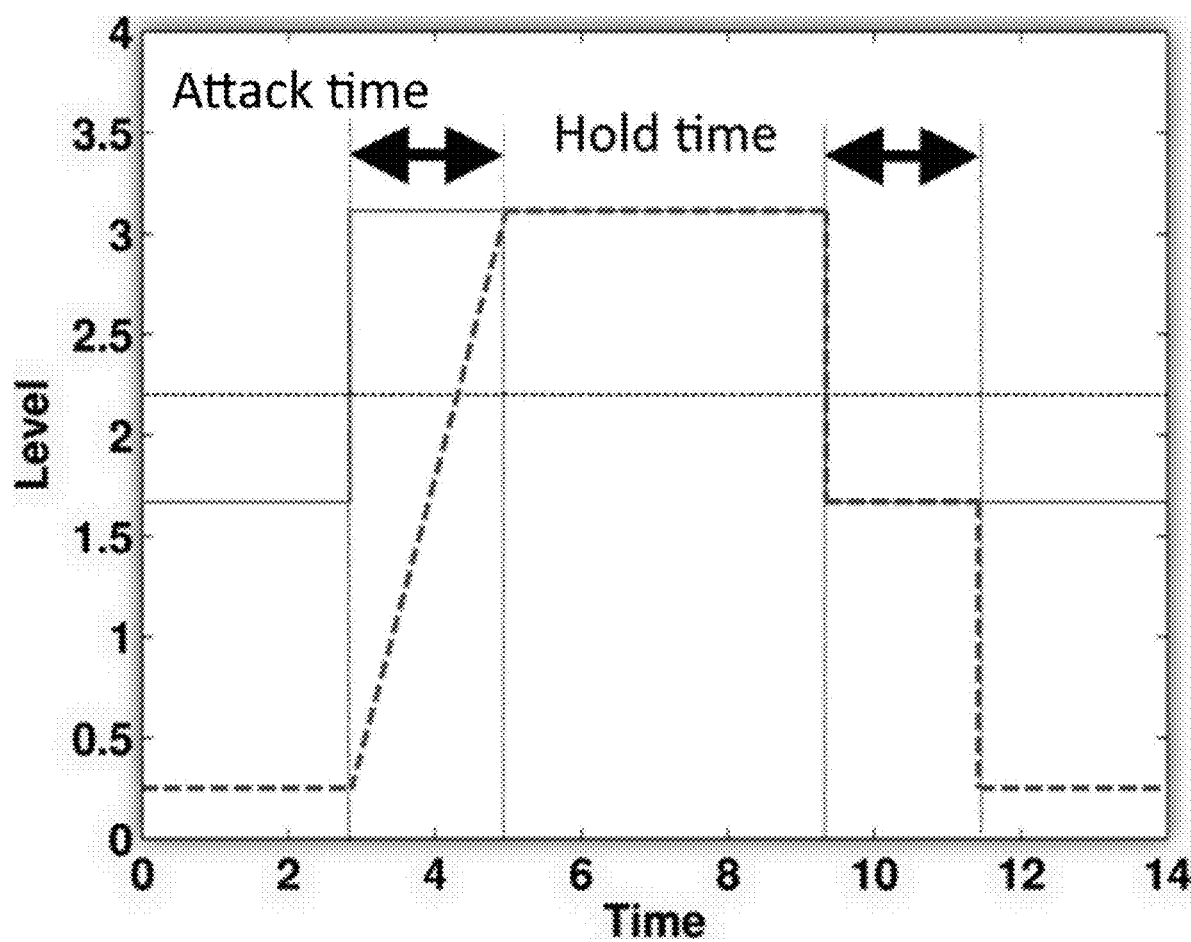

Referring to FIG. 6C, illustrated is the hold time feature which may be used with the noise gating method. This feature keeps the gate open for a certain time after the signal level falls below the threshold.

Figure 6D:
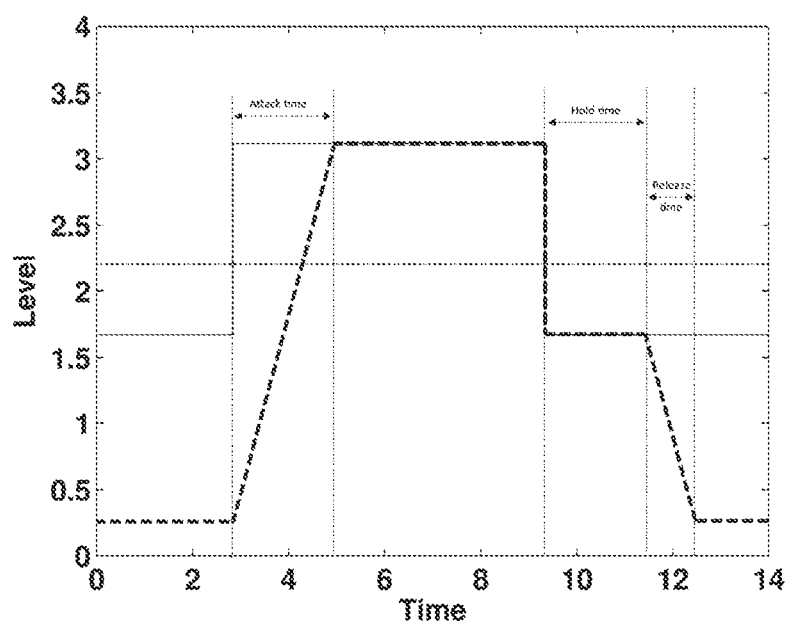

Referring to FIG. 6D, illustrated is the release time feature which may be used with the noise gate method. For this feature, an attack time is used, the gate is held open for an amount of time after the signal level drops below the threshold and the gate is gradually closed.

Figure 6E:
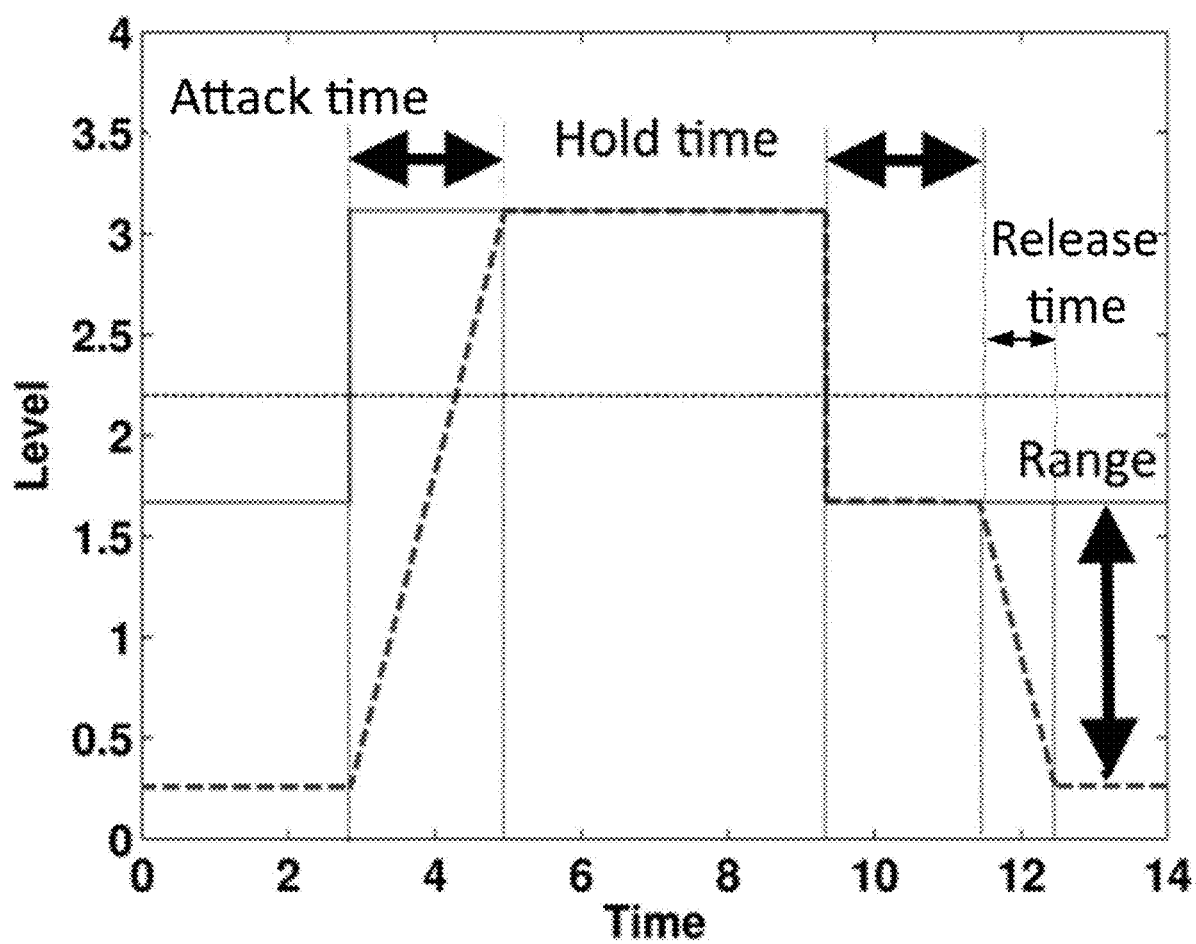

In FIG. 6E, the attenuation range is shown. This attenuation range defines how much the signal is attenuated by when the gate is closed.

Figure 6F:
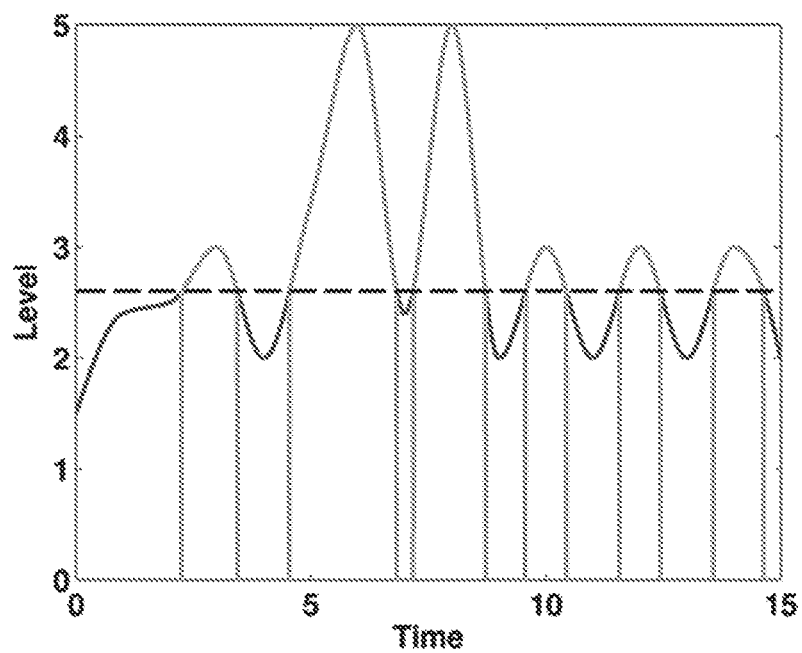
Figure 6G:
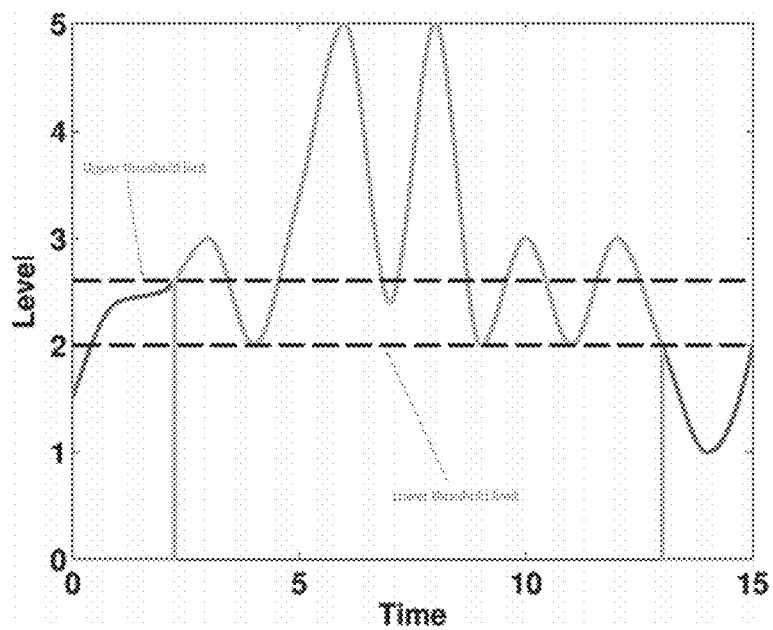

In FIGS. 6F and 6G, the hysteresis effect is shown by introducing upper and lower values for the threshold. The gate opens when the noisy signal is higher than the upper threshold and closes when it falls below the lower threshold.

Other features such as the Look-Ahead function may also be implemented. The Look-Ahead function allows the gate to open ahead of time to capture sudden events in the signal. This is because the attack time gradually opens the gate once the signal levels cross the threshold. Without the look ahead function, sudden events will be attenuated and not captured in the filtered signal.

Figure 8:
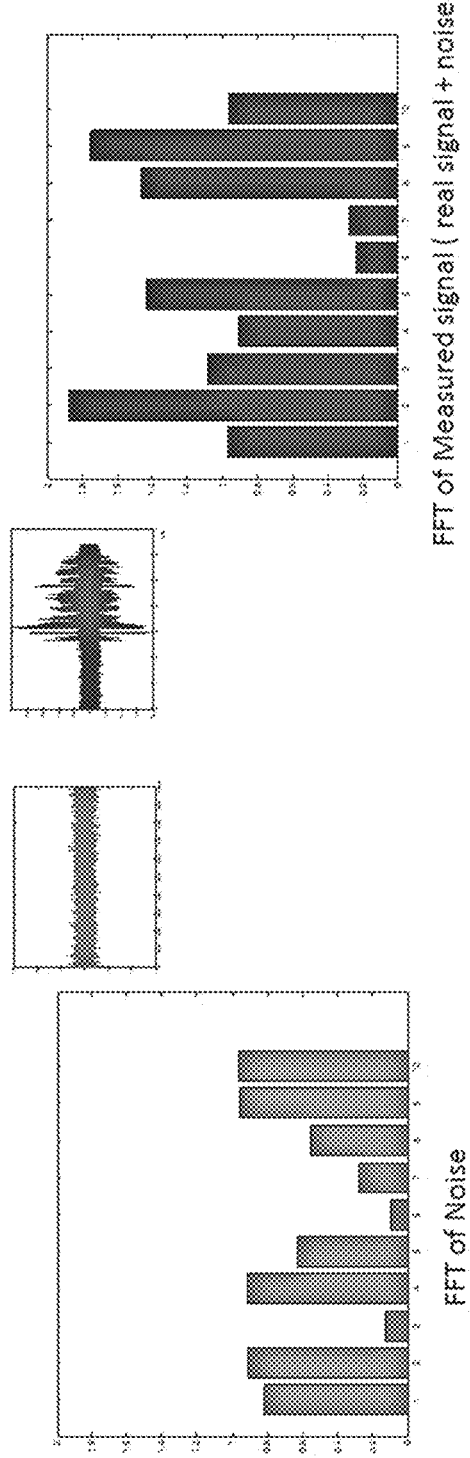
FIG. 8 illustrated the FFTs of noise and real measurements signals.
Figure 7:
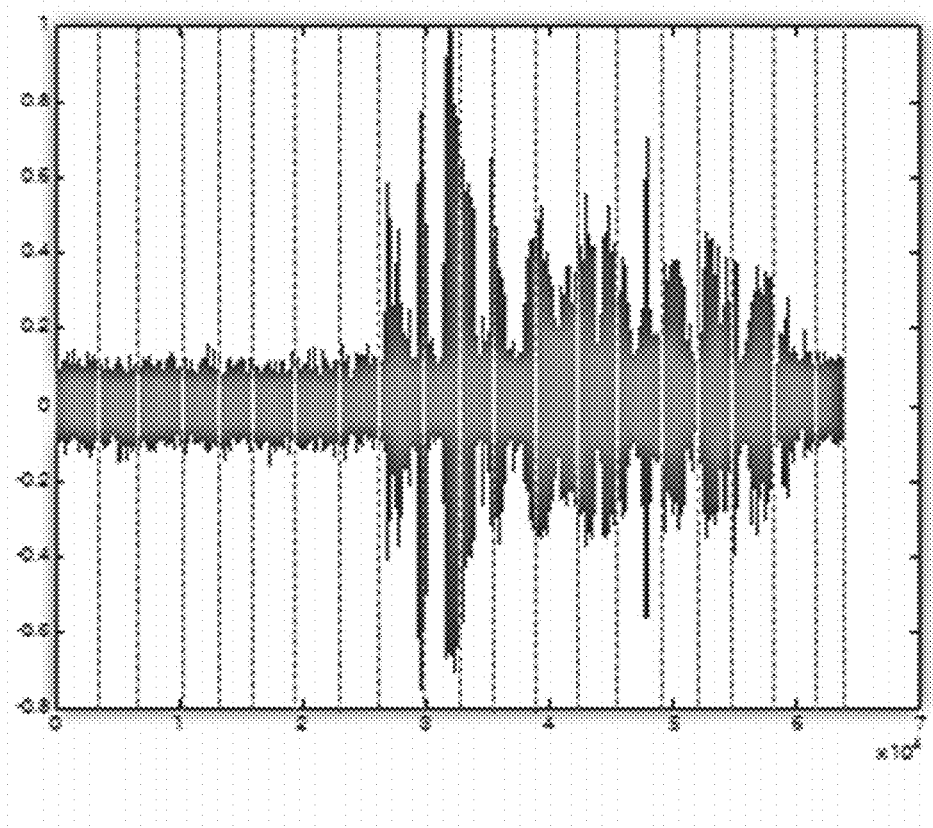
FIG. 7 show noise gating time domain segments.
Figure 9:
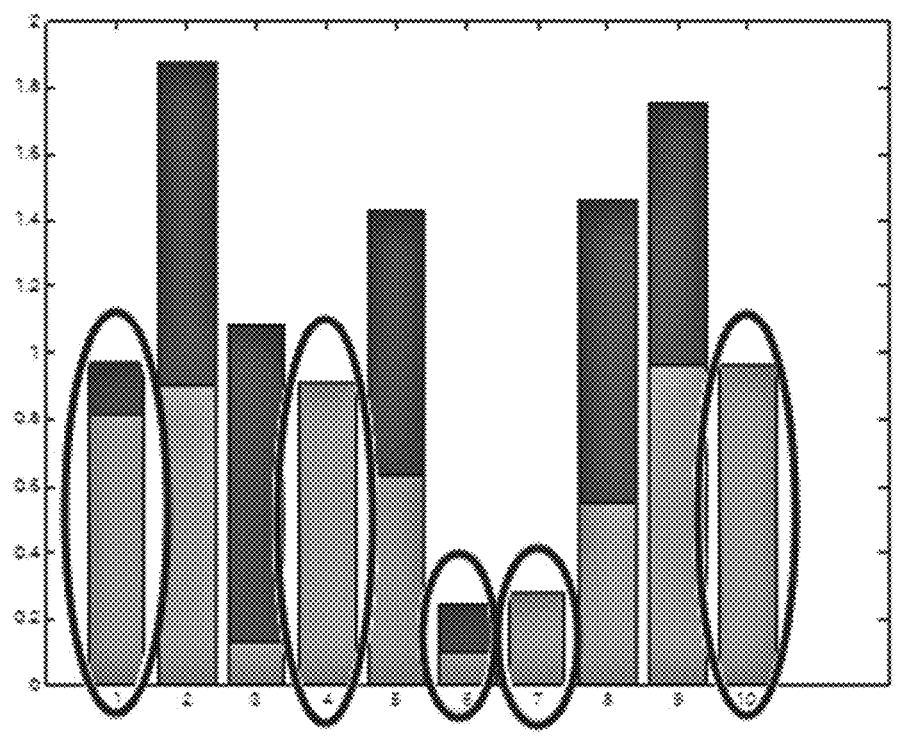
FIG. 9 illustrate the effects of frequency bin thresholding.
Figure 10:
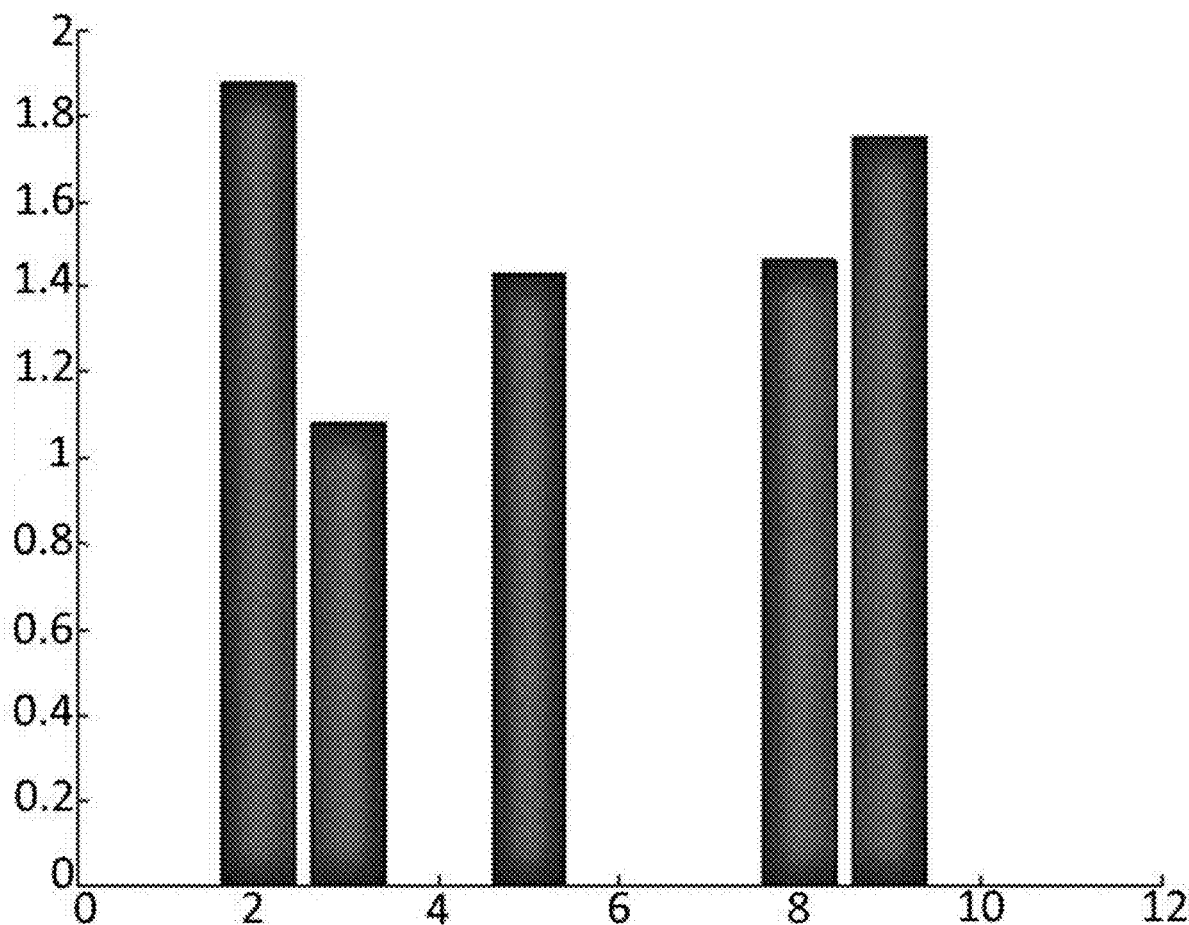
FIG. 10 show the FFT of a filtered signal.

It should be noted that while all the previous features are explained in the time domain, noise gating is a spectral method and thus depends on the frequency domain. Therefore the gate opens and closes based on individual frequency bins. To explain that further, the measured noisy signal such the one shown in FIG. 7 is broken down into small time segments (with a size of time constant τ). For each window, the spectrum is found by using a Fourier Frequency Transform (FFT) and individual frequency bin levels are found. Each frequency bin includes the power level at a specific frequency. The number of the frequency bins depends on the spectrum size (γ). Each time segment spectrum is compared with the noise profile spectrum. Assuming that only ten frequency bins are created, an output example of a segment and noise FFTs is shown in FIG. 8. By comparing the level of frequency bins between the measured and the noise signals, the gate is either deployed or not. As an example, in FIG. 9 it can be seen that the level of the frequency bins of the measurement (dark) compared to the noise (light) are not satisfactorily larger for some bins (circled in black). Hence, applying the gate at these frequency bins would filter out the signal and the output will be as shown in FIG. 10.

The last step that is applied before performing the Inverse Fourier Frequency Transform (IFFT) is the Frequency Smoothing feature. This feature is implemented to prevent sudden changes in the tones between two frequency bins. The Frequency Smoothing feature is basically a moving average for the frequency bin levels. The width of the moving average window is determined by the user and given the symbol (Δω). The feature smooths the frequency bins as shown in Equation 1.

$$\text{spectrum}(\omega) = \frac{\sum_{v=-\Delta\omega/2}^{v=\Delta\omega/2} \text{spectrum}(\omega+v)}{\text{number of frequency bins in } \Delta\omega} \quad (1)$$

Figure 11:
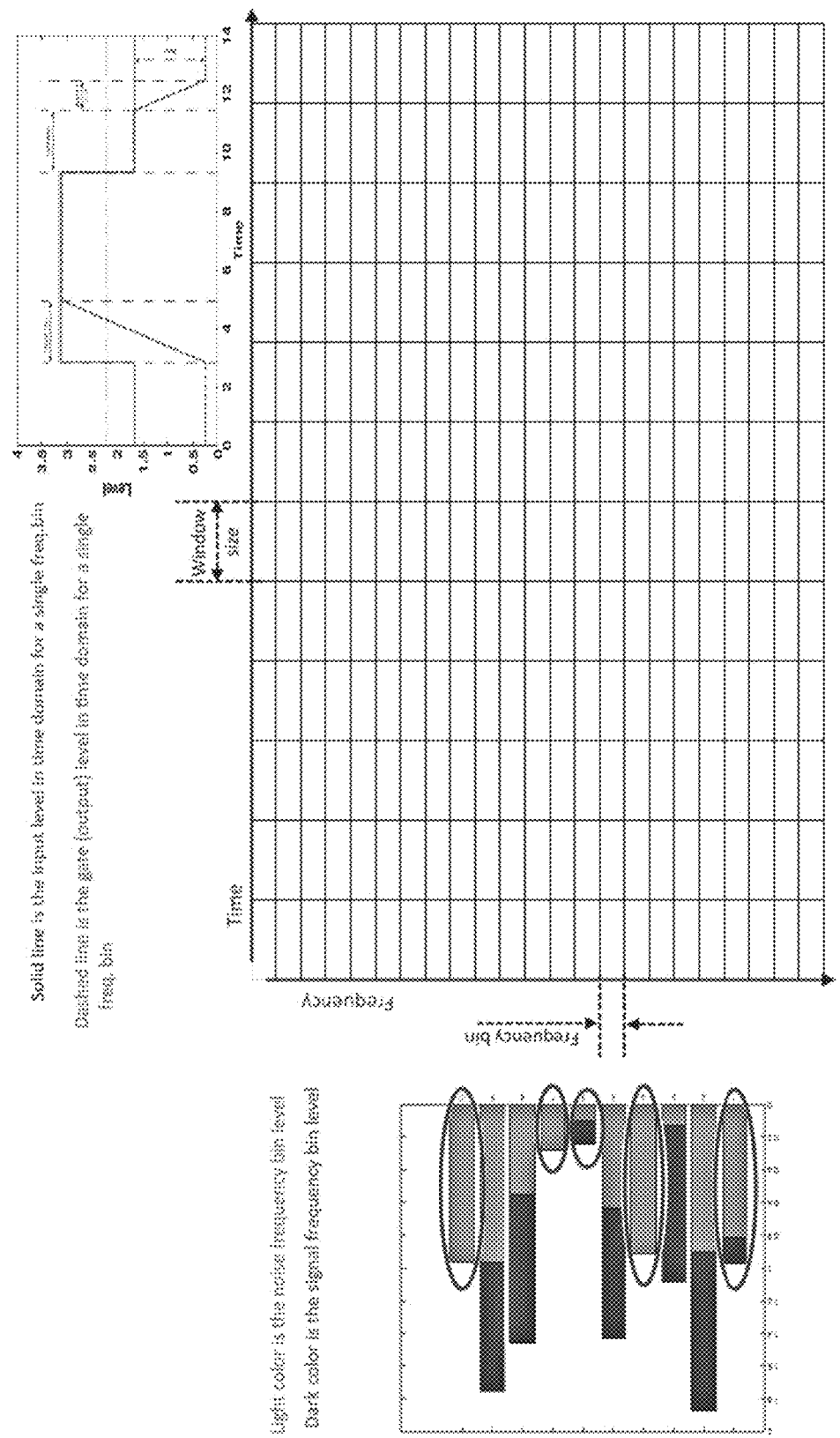
FIG. 11 schematically illustrates the noise gate method according to one implementation of the present invention.
Figure 12:
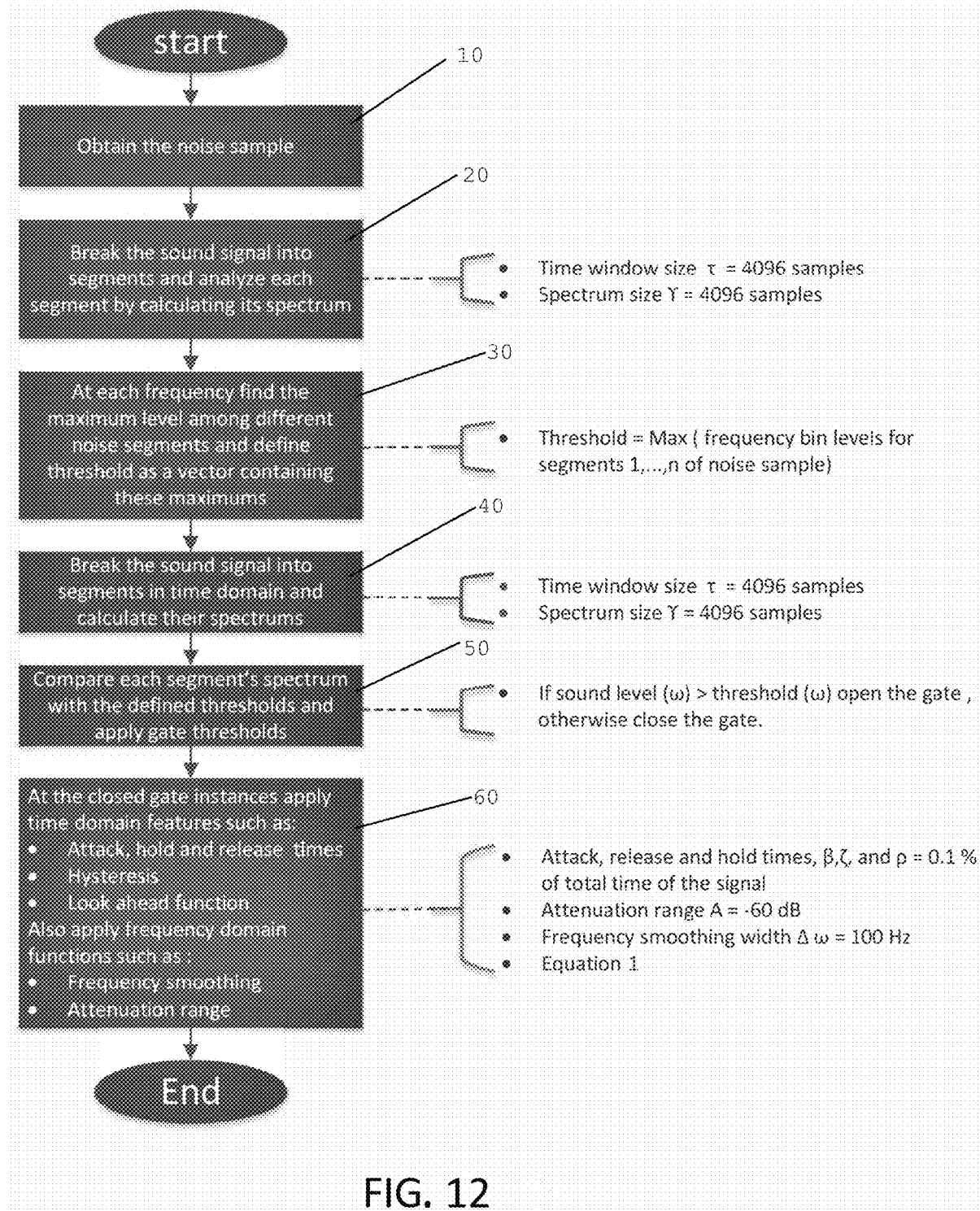
FIG. 12 is a flowchart detailing the steps in a method for filtering background noise that may be used with the present invention.

The summary of the noise gating method is shown in FIG. 11. In the figure, the signal is broken into both time and frequency domains. Frequency bins in each time segment are attenuated if the signals crossed the noise profile threshold. Other features such as frequency smoothing, attack time, hold time, release time, hysteresis, and attenuation range are also applied to enhance the quality of the background noise isolation across all time segments. The steps for applying Noise Gating are shown in a flow chart in FIG. 12. The steps are as follows:

obtain the noise profile sample (step 10);

the noise sample is divided into small time domain windows, and each window width is defined by τ (step 20);

calculate the spectrum of each noise window using FFT with spectrum size γ (step 20);

at each frequency, the maximum level of different noise windows is found (step 30);

the threshold vector is stored, and it has the maximum levels at each frequency as defined in the last step (step 30);

the sound signal is obtained and split into segments similar to the noise signal using a window width τ, and then calculate each segment's FFT with the size of γ (step 40);

each segment's FFT frequency levels is compared with the defined threshold (step 50); and When the sound frequency levels is lower than the threshold, different features such as attack, hold and release times (β, ξ, and ρ) are applied, then the attenuation range A and smoothing of the resulting frequency bins with the width of Δω from Equation 1 are applied (step 60).

Figure 1:
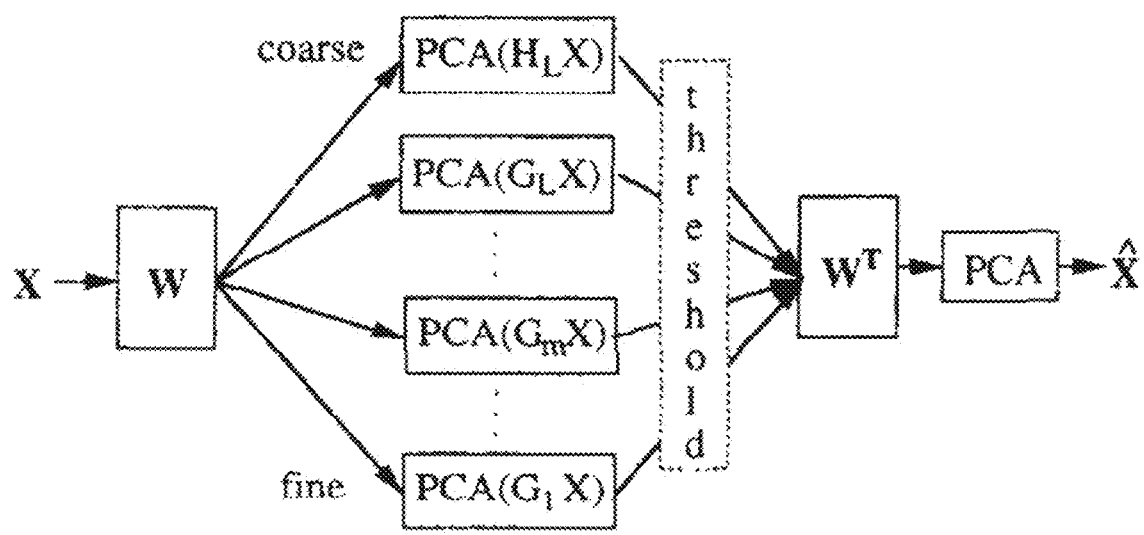
FIG. 1 illustrates a methodology for multi-scale PCA according to the prior art.
Figure 2:
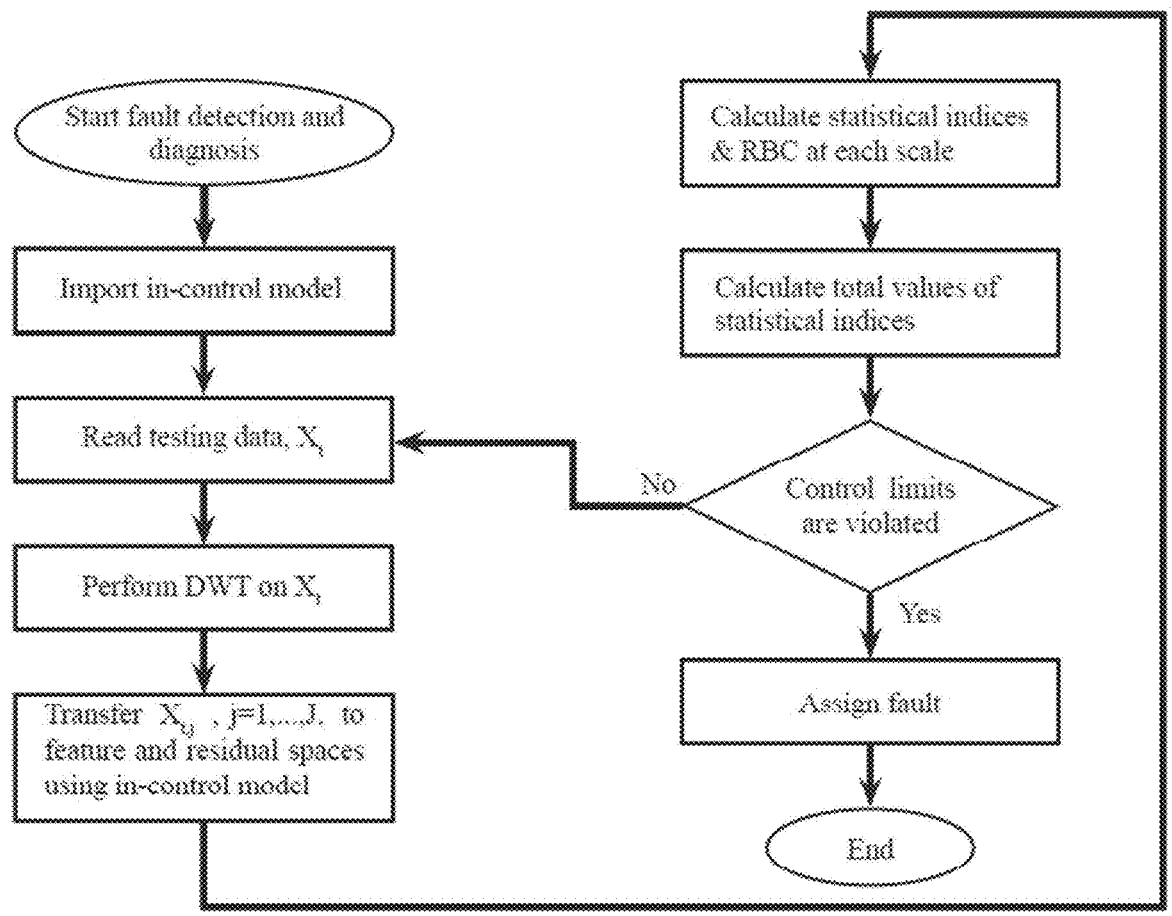
FIG. 2 details the steps for MSPCA and Contribution plots FDD analysis according to the prior art.
Figure 3:
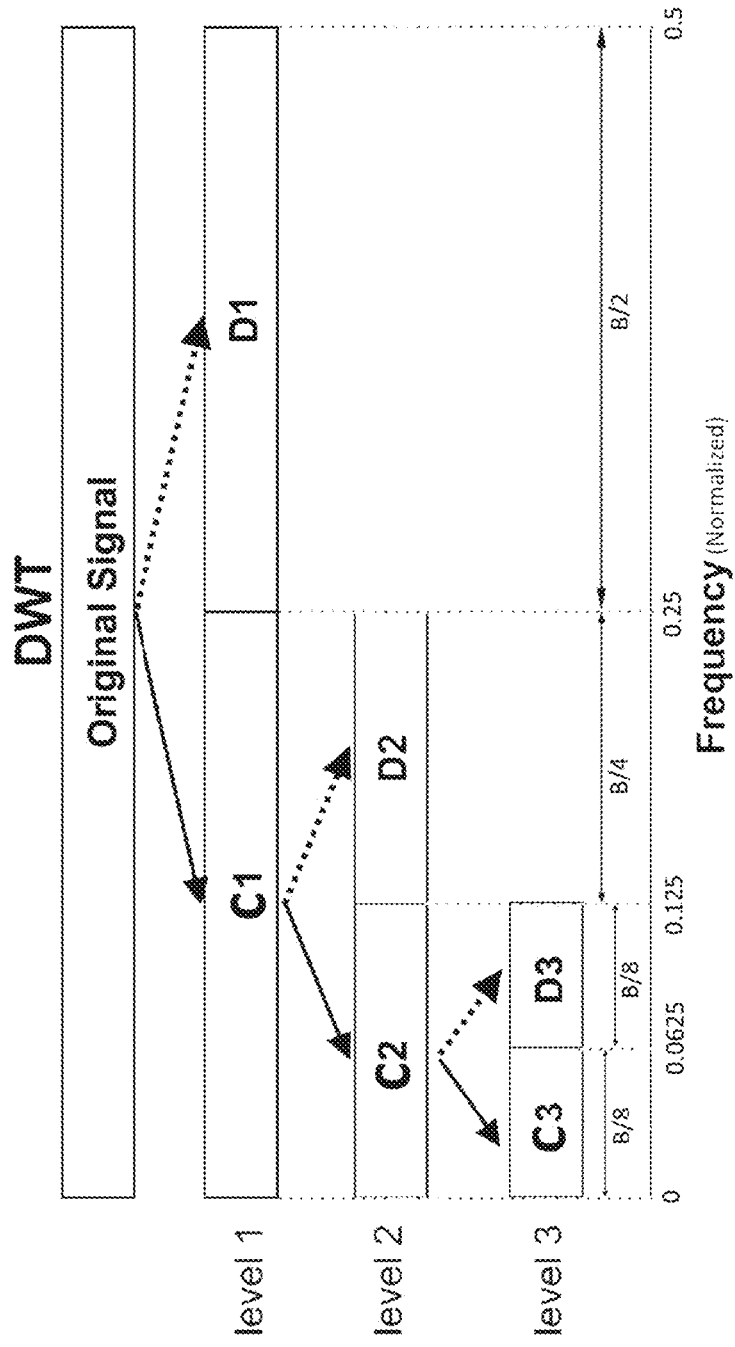
FIG. 3 shows DWT frequency levels bandwidths.
Figure 13:
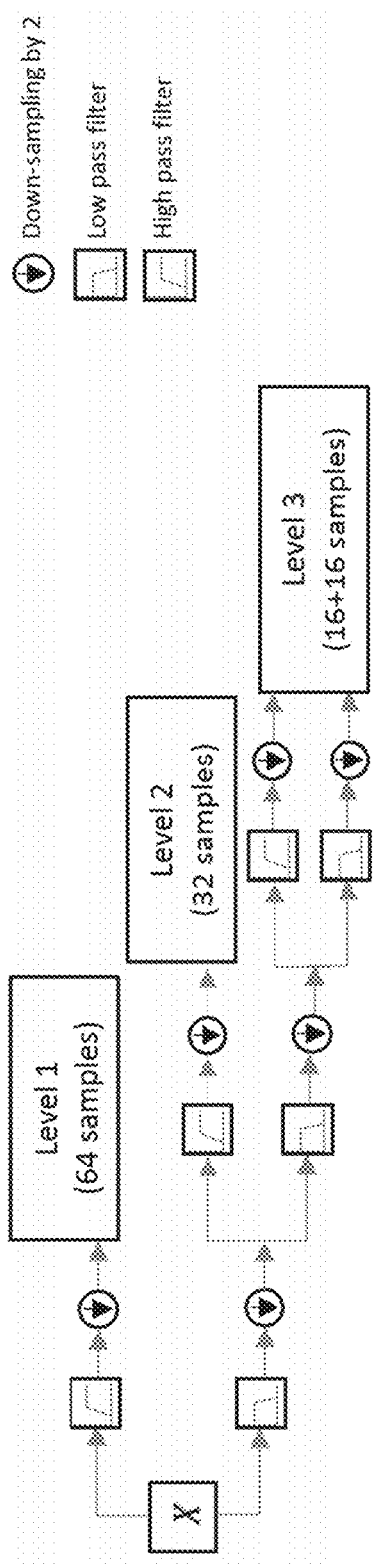
FIG. 13 schematically illustrates the DWT of a signal with 128 samples.

Once the noise is filtered out from the measured signals, the signals are ready for the FDD analysis. The second stage or module of the system is the core of the FDD analysis. The inventors have terms this analysis the Extended Multi-Scale Principle Components Analysis (EMPSCA). This tool extends the capabilities of MSPCA and hence the name. A number of innovations are introduced in this stage. MSPCA uses DWT to decompose the measured signals into frequency levels. The coefficients of each level have a bandwidth of frequencies that the measured signal contains. However the bandwidth varies from a level to another. DWT levels are shown in FIG. 13 with the signal's spectrum broken down in FIG. 3. The bandwidth of each level is shown in Table 1, where $\Delta_f$ is the bandwidth of each frequency level.

Figure 14:
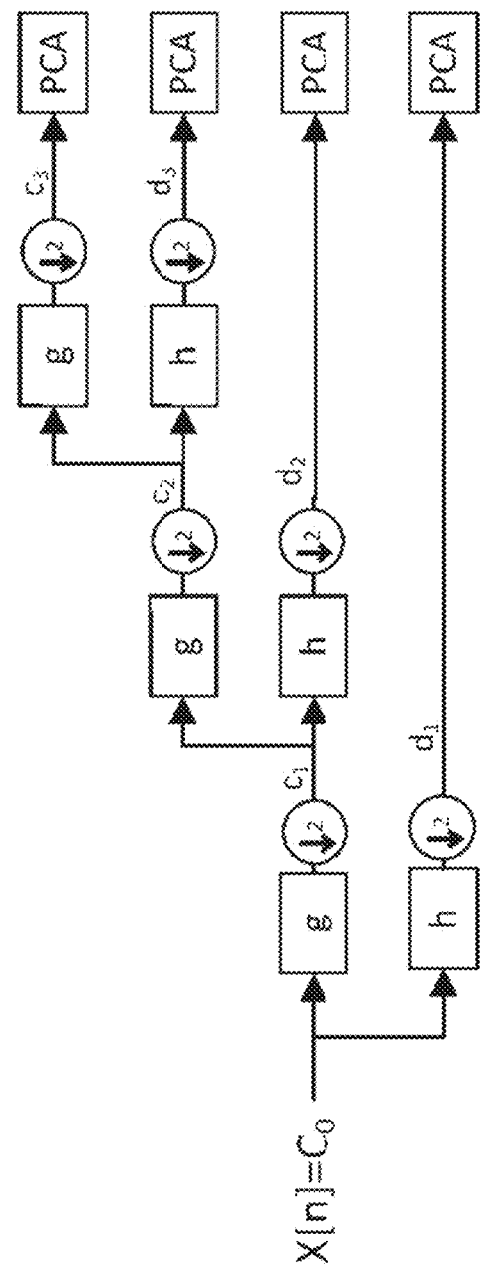
FIG. 14 schematically illustrates FDD decomposition as practiced using MSPCA.

The different bandwidths cause a problem in detecting the bandwidth of detected faults in MSPCA. To clarify this further in MSPCA, PCA is the tool which is responsible for fault detection. As shown in FIG. 14, the inputs to the PCA tool are the samples/coefficients of DWT frequency levels. From FIG. 14, it can be seen that when a fault is detected in the first level (which contains half the spectrum), no further information can be extracted about that fault. Thus, MSPCA cannot differentiate between different high frequency faults. The mathematical description of the DWT decomposition is shown in Equations (2) and (3), where $c_j$ is the approximation coefficients of level j. These coefficients are called approximation as they result from the low pass filter g. Similarly $d_j$ are the detail coefficients of level j and they are called detail coefficients as they result from the high pass filter h:

$$c_{j+1}[n]=c_j*g_j[2n] \qquad (2)$$

$$d_{j+1}[n]=c_j*h_j[2n] \qquad (3)$$

Figure 15:
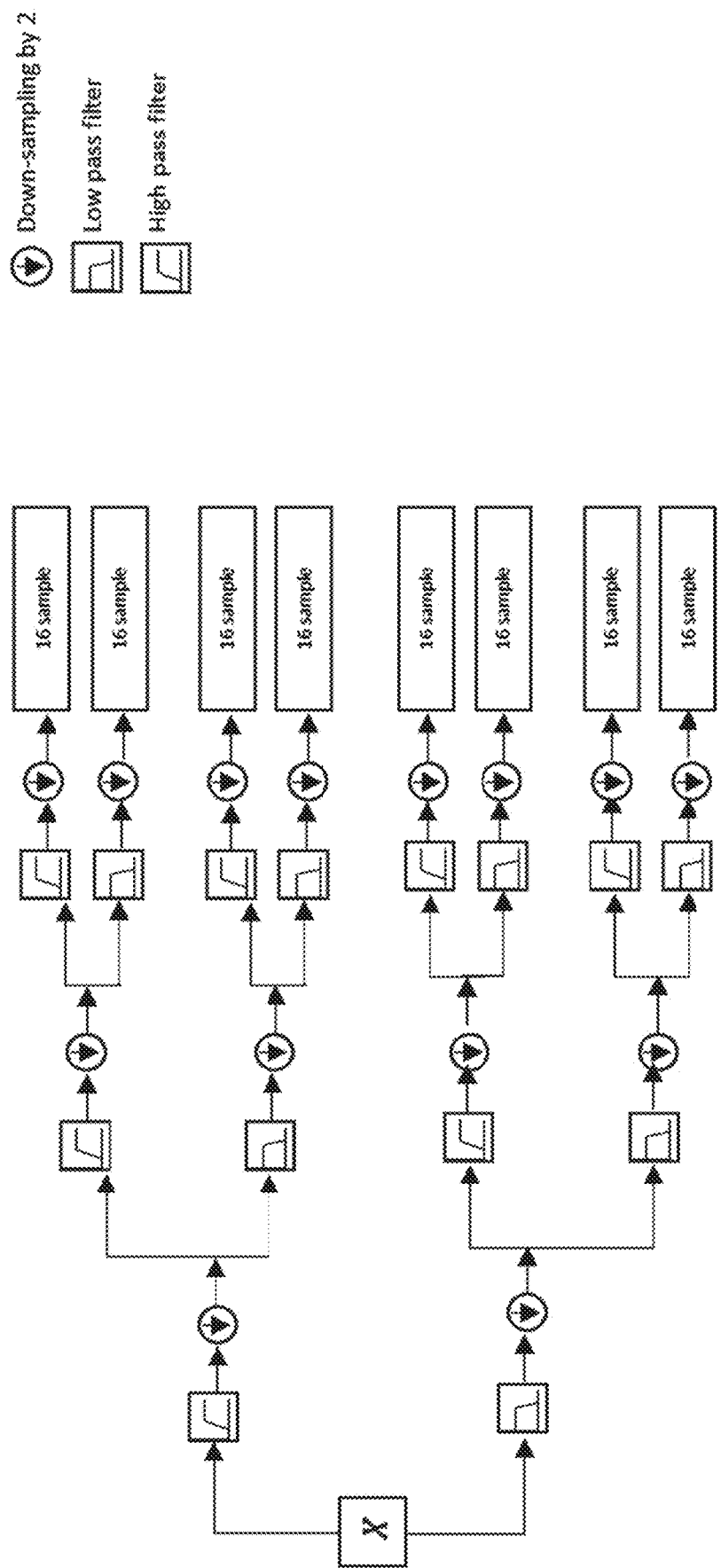
FIG. 15 schematically illustrates the WPT of a signal with 128 samples.
Figure 16:
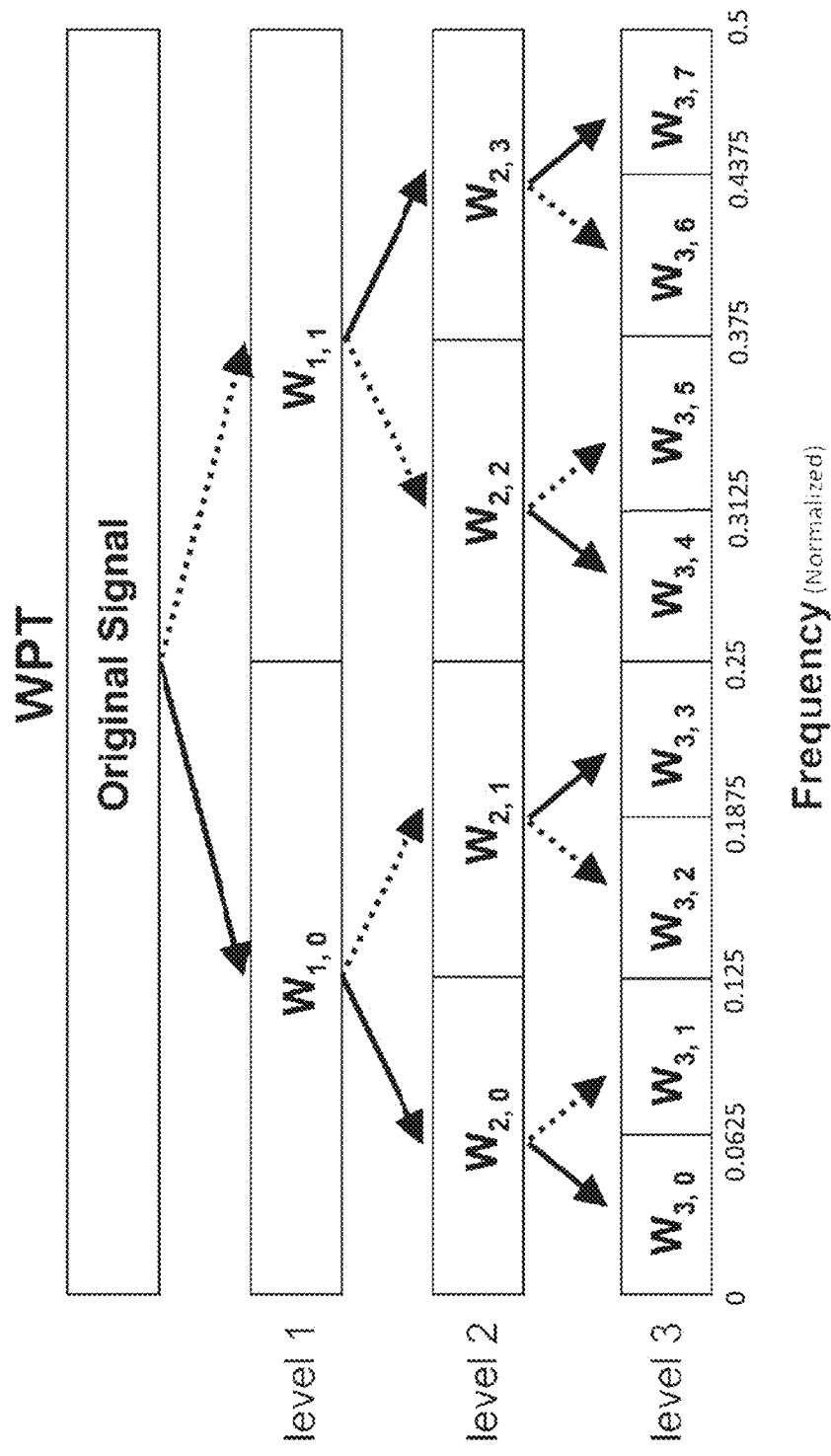
FIG. 16 illustrated the frequency bandwidths of WPT coefficients.

In EMPSCA or in one method aspect of the present invention, another version of a wavelet transform is used. For this aspect, the Wavelet Packet Transform (WPT) is used, and in it, both outputs of the high and low pass filters are further filtered to the next level. By comparison, in DWT only the output of the low pass filter is broken down in the next level. WPT decomposition can thus be as shown in FIG. 15. The bandwidths of different levels of WPT are shown in FIG. 16, and are mathematically described in Equations (4) and (5) below, where $W_{j,k}$ represent the coefficients at level j for the atom k. If k is even, then these coefficients result from low pass filtration. If k is odd then these coefficients result from the high pass filtration.

$$W_{j+1,2k}[n]=W_{j,k}*g_j[2n] \qquad (4)$$

$$W_{j+1,2k+1}[n]=W_{j,k}*h_j[2n] \qquad (5)$$

As shown in FIG. 16, the bandwidths of all atoms are equal ( $$\Delta_f = \frac{F_s}{16}$$

in this example).

The resulting coefficients from WPT are afterwards fed to a PCA tool which has a design similar to the PCA tool used in MSPCA. Because of this, when the PCA tool detects a fault in one of the atoms, the fault can be isolated to that thin bandwidth. For example, if it was assumed that there are two sinusoidal faults in the measured signals that have $$\left(\frac{3F_s}{4} = \frac{12F_s}{16}, \text{ and } \frac{14F_s}{16}\right)$$

frequencies, EMSPCA (or the system and method of the present invention) can differentiate between these faults but MSPCA cannot.

Figure 17A:
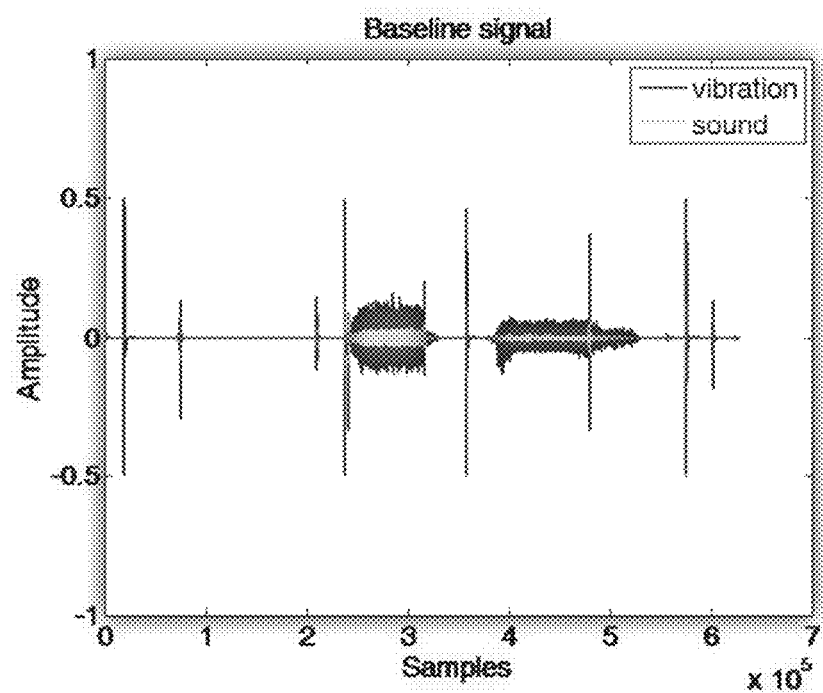
FIGS. 17A-17C illustrate fault cases that are undetectable using MSPCA but are detectable using the present invention.
Figure 17B:
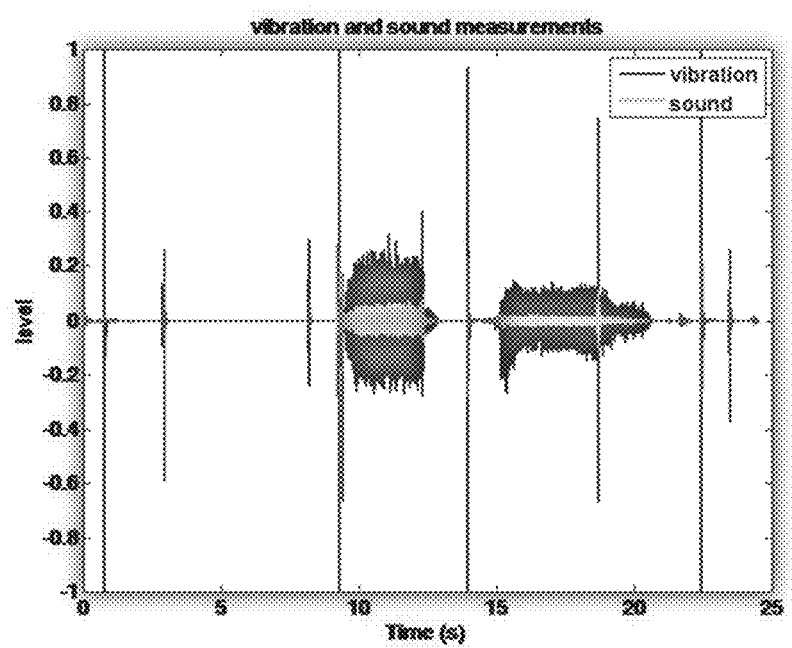
Figure 17C:
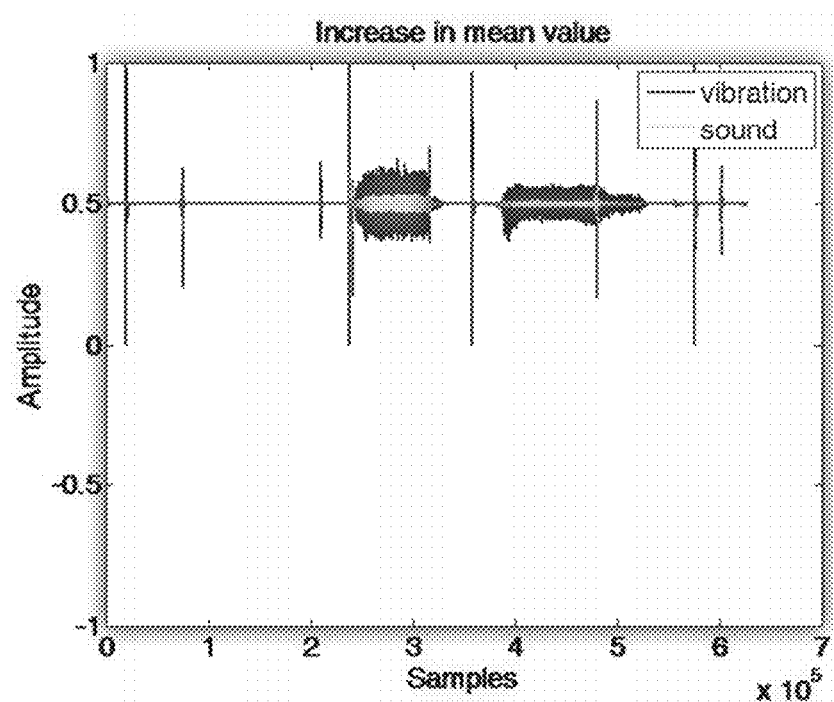

Another step which generalizes the present method and system is that of using a normalization technique on the raw data. The motive behind this step is to allow the system and method of the present invention to accurately detect and diagnose faults in the case of different measurement types. This is an issue when the measured signals have different amplitudes levels and variances. To understand the significance of this step, two fault cases are illustrated and which are described in relation to FIGS. 17A-17C. FIG. 17A provides a baseline signal while FIG. 17B shows sound and vibration measurements (based on the baseline signal) with increasing individual signal variances. FIG. 17C shows the case where there is a variation in the mean of the individual signals.

MSPCA depends on PCA for fault detection by examining the correlation structure between the measured signals. Therefore, if faults preserve the correlation structure between the signals, they will be undetectable. The above noted two types of faults (with increasing individual signal variances and with a variation in the mean of individual signals) preserve the correlation structure. In MSPCA and similar methods, PCA is used in data normalization to scale the signals. This normalization affects the feature extraction. Currently, there are two normalization techniques in PCA analysis:

a—a normalization technique termed centered or covariance PCA, where the mean value is subtracted from the raw signals; and b—a normalization technique termed correlation PCA where the mean value of the raw signals is subtracted and afterwards divided by the standard deviation of the individual signals, which results in normalized data fed to the PCA tool.

However in both methods the baseline signals are normalized using their own centerlines and variances, and testing signals are normalized using their own centerlines and variances, as shown in Equation (6) and (7):

$$\text{Normalized baseline signal} = \frac{\text{baseline signal} - meanvalue(\text{baseline signal})}{\text{Variance}(\text{baseline signal})} \qquad (6)$$

$$\text{Normalized testing signal} = \frac{\text{testing signal} - meanvalue(\text{testing signal})}{\text{Variance}(\text{testing signal})} \qquad (7)$$

Applying the normalization in this manner allows the two faults mentioned above to be undetectable by MSPCA. To solve this issue the normalization technique is modified to thereby normalize the testing signals using the baseline signal mean value and variance as shown in Equation (8) and (9):

$$\text{Normalized baseline signal} = \frac{\text{baseline signal} - meanvalue(\text{baseline signal})}{\text{Variance}(\text{baseline signal})} \qquad (8)$$

$$\text{Normalized testing signal} = \frac{\text{testing signal} - meanvalue(\text{baseline signal})}{\text{Variance}(\text{baseline signal})} \qquad (9)$$

Figure 18:
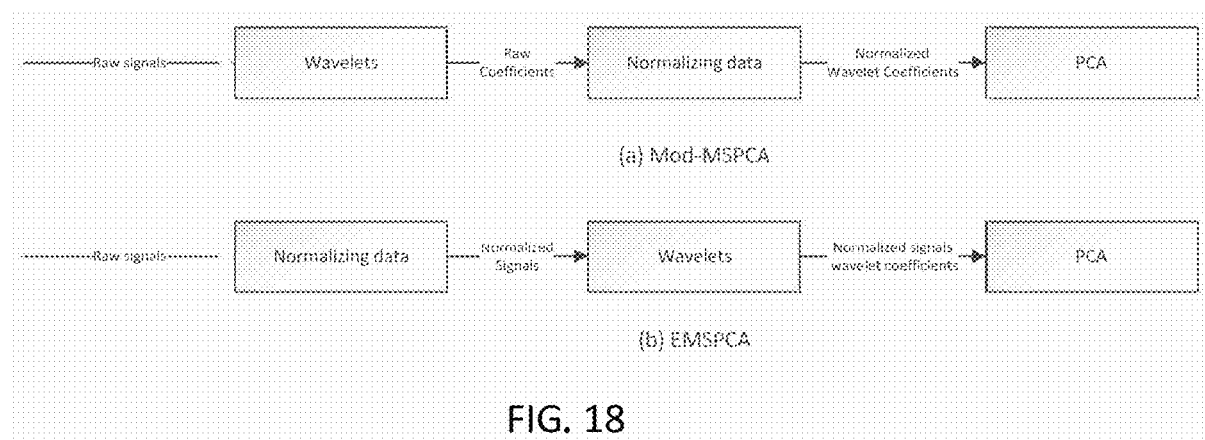
FIG. 18 schematically illustrates normalization in MSPCA and in the present invention.

This change enables the systems and methods of the present invention (also known as EMSPCA) to detect faults that preserve the correlation structure between measured signals. Moreover, to avoid the effects of the wavelet transform on the coefficients at different levels, the normalization step is applied before the use of the wavelets transform in EMSPCA. This is different from MSPCA where the normalization step is applied before PCA step. This modification is illustrated in FIG. 18. Applying the new normalization (Equations (8) and (9)) along with the sequencing shown in FIG. 18 boosts the robustness of EMSPCA in fault detection and diagnosis.

To detect faults using PCA analysis, a transformation (described in Equation (10)) is applied on the measurements, where X is the measurement matrix formed by $X=[x_1\ x_2\ \ldots\ x_n]$ and where $x_i$ is a column vector that represents the data of a measured signal. P is called the Principal Components Loading matrix and it is a matrix formed by columns of the eigenvectors of the measured signals X. T is called the Principal Components scores and it is a matrix $T=[t_1\ t_2\ \ldots\ t_n]$ formed of the corresponding uncorrelated signals to the cross-correlated signals X. The covariance of the Principle Components scores T is shown in Equation (11).

$$T = XP \tag{10}$$

$$\sum_T = \frac{1}{n-1} T'T \tag{11}$$

In many MSPCA applications, traditional statistical techniques inherited from PCA analysis are used, such as Hotelling's T-squared ($\tau^2$) and Squared Prediction Error (SPE, $\varphi$). Hotelling's $\tau^2$ and $\varphi$ are usually used for fault detection by comparing their values with a threshold. However it is usually hard to define an accurate threshold that does not detect normal noise as faults and that detects low amplitude faults. For fault isolation, contribution plots are usually used. However, contribution plots do not always accurately show which signal carries the fault. To solve these problems, two statistical indices are presented in Haqshenas, S. R., "Multiresolution-Multivariate Analysis of Vibration Signals; Application in Fault Diagnosis of Internal Combustion Engines", (2013). The first was introduced for fault detection purpose. The index is called $S_c$ and it detects if any faults exist in different frequency levels. $S_c$ is described in Equation (12) where $\Sigma_{T,testing}$ and $\Sigma_{T,baseline}$ are defined in Equations (13,14):

$$S_{c,j} = \sum_{i=1}^{m} \frac{\sum_{i=1}^{m}\left(\sum_{T,testing} - \sum_{T,baseline}\right)_j \circ \left(\sum_{T,testing} - \sum_{T,baseline}\right)_j}{\lambda_i} \tag{12}$$

$$\sum_{T,baseline} = COV(T_{baseline}) = COV(X_{baseline} P_{baseline}) \tag{13}$$

$$\sum_{T,testing} = COV(T_{testing}) = COV(X_{testing} P_{baseline}) \tag{14}$$

In the Equations, $\lambda_i$ is the variance of Principal Components of the baseline for signal i. The second index Haqshenas introduced is called $F_c$ and it was introduced for use in fault diagnosis/isolation. $F_c$ is defined as follows:

$$F_c = \left(\sum_{i=1}^{m} COV(F) \circ COV(F)\right) \circ \sum_\lambda \tag{15}$$

where $\Sigma_\lambda = [\lambda_2\ \lambda_2\ \ldots\ \lambda_n]$ is a vector that contains the inverse of PC variances ($\lambda_i$) and F is defined in Equation (16) as faults component in the measured signals. This faults component forms the difference between the testing and the baseline signals. This is described in Equation (16) by modeling faults in an additive form.

$$X_{testing} = X_{baseline} + F \tag{16}$$

These new indices that Haqshenas introduced ($S_{c,j}$, $F_c$) are efficient and fast to calculate, but they suffer from the same problems as $\tau^2,\varphi$ and the contributing plots. The problems are the different sensitivities of faults in fault detection across different frequency levels and in fault diagnosis across input signals. Applying the above mentioned normalization and upgrading $F_c$ allows $F_c$ to be used for fault detection as well as fault diagnosis. This upgrade is done to have equal quantitative representation of faults in different frequency levels in $F_c$ index. This is shown in the following Equations:

$$F_{c,j} = sign(L_j) \circ \sqrt{|L_j|} \tag{17}$$

Where, $$L_j = \sum_{i=1}^{m} sign(COV(F))_i \circ [COV(F) \circ COV(F)]_j \tag{18}$$

Comparing Equations (17), (18) with Equation (15), the new $F_c$ statistic is different in that it:
removes the variance normalization ($\Sigma_\lambda$ in Equation 15)—the raw data is normalized in a better fashion as discussed in Equations (8), (9) and with reference to FIG. 18;
introduces the square root in Equation (17) and thereby assures equal representation of faults across various levels and signals;
adds the sign function which is beneficial in case a new observation has less vibration or sound levels—when the $F_c$ sign becomes negative, this helps the classifier;
differentiates between additive and subtractive differences. This consequently avoids misdiagnosis of an observation as a faulty part, instead of assigning it as a healthy part and vice-versa.

Figure 19:
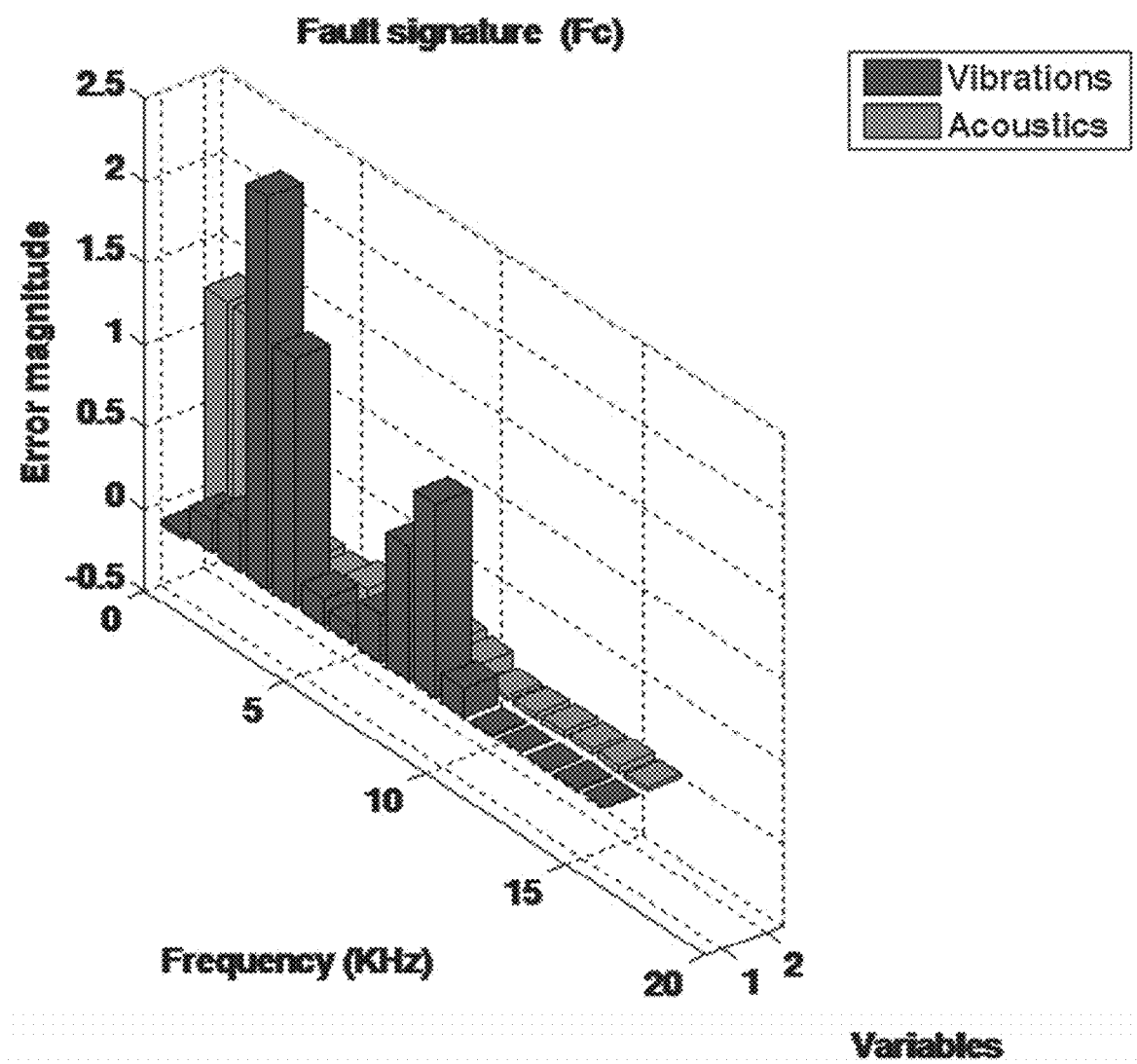
FIG. 19 illustrates an alternator fault signature.

These differences boost fault detection and diagnosis abilities, as $F_{c,j}$ represents fault components in each frequency level and describes which input signal contains faults. The output of $F_{c,j}$ is called the "fault signature", and when it is plotted in a bar diagram it gives a unique shape per fault. An example of a fault signature for an alternator is shown in FIG. 19, where the measurements are vibration and sound signals. The figure shows that the faults are extracted as well as the severity of faults in each frequency level. The plot also shows that it is easy to detect which variable (sound or vibration) contains this extracted fault at which frequency.

Figure 20:
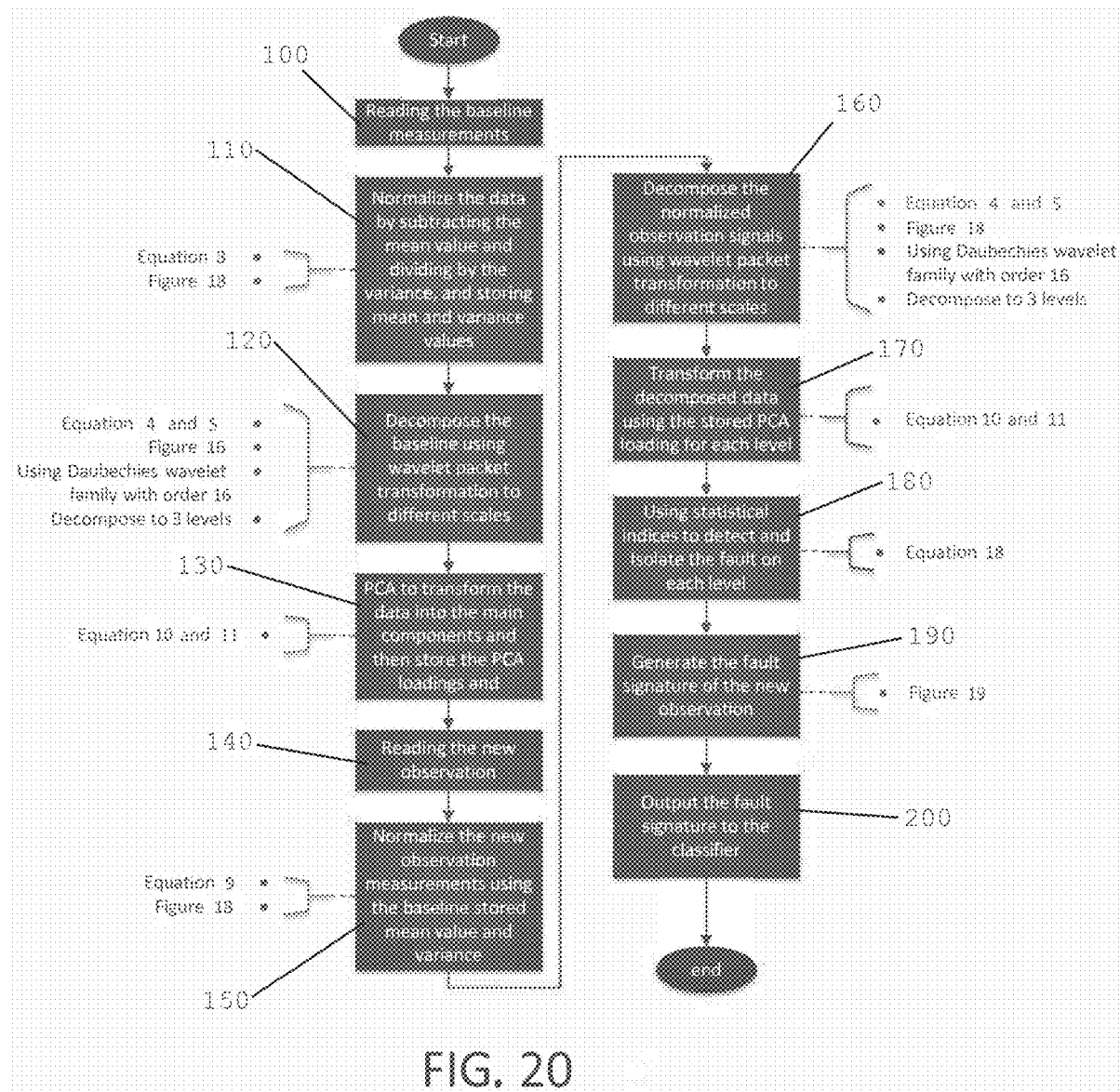
FIG. 20 is a flowchart detailing the steps in a method according to one aspect of the present invention.

For ease of reference, a summary of the steps of one method of the present invention (termed the EMSPCA method) is shown in FIG. 20 as a flow chart and with reference to the relevant equations described in this text. In this method, the initial step is that of reading the baseline measurements (step 100). The data from the measurements is then normalized (step 110). The baseline is then decomposed using WPT (step 120). PCA is then used to transform the data into its main components (step 130). A new observation can then be made (step 140) and the data from this new observation is normalized (step 150) using the mean value and variance from the baseline measurements. The normalized observations are then decomposed (step 160) and the decomposed data is then transformed using the stored PCA loading for each level (step 170). Statistical indices are then used to detect and isolate faults on each level (step 180) and a fault signature is generated for the new observation (step 190). The generated fault signature is then sent to the classifier for classification (step 200).

Figure 21:
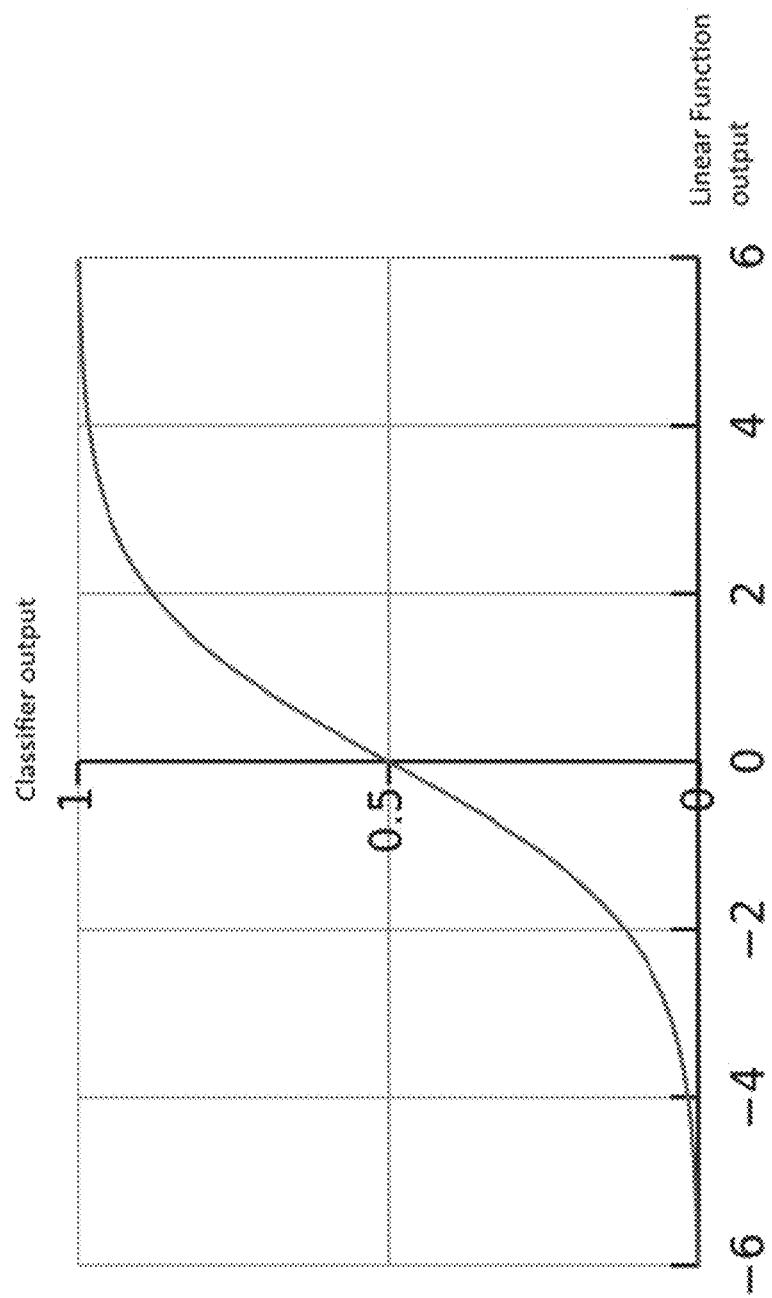
FIG. 21 illustrates an S-shape for a logistic discriminant classifier.

In the above described second stage, the method and system of the present invention have been fine-tuned by using WPT, a smart normalization technique, and by using a new statistical index $F_{c,j}$ which represents a fault with even sensitivity across different frequency levels and different input signals. These changes allow EMSPCA (and the present invention) to reproduce the same fault signature (with minor variations) for the same fault. While these fault signature charts are very easy to understand, for an industrial environment, further simplification is required for the output to be readable by operators. This is because a fault, such as bearing or armature faults, may manifest its signatures in one measurement such as the sound signal, or in multiple measurements. Therefore, domain knowledge is required for mapping fault signatures to their source in diagnostics. An automatic mapping omits the requirement of having domain experts to read the fault signature. For that reason, a classifier was implemented. The classifier is trained in a supervised manner. In other words, fault signatures are given to the classifier with the fault label. Afterwards in testing, the classifier compares the fault signature which is under test with the known fault signatures. The classifier produces a percentage representation how similar the tested fault signature matches each of the known fault signatures. In one implementation of the present invention, a logistic discriminant classifier is used to perform the classification step. For N faults, (N+1) binary logistic discriminant classifiers are trained to account for all the faults and the healthy baseline condition. Each classifier uses the sigmoid function, described in Equation (19), to map a linear function ($\alpha = w^T F_{c,i} = w_1 f_1 + w_2 f_2 + \ldots$) to an S-shape curve which is shown in FIG. 21.

$$\sigma(w^T F_{c,i}) = \frac{1}{1 + e^{-w^T F_{c,i}}} \quad (19)$$

It can be seen that, from Equation (19), the logistic discriminant classifier uses the fault signature values ($F_{c,i}$) of the training data samples to train the classifier (in training mode) and then to test the classifier (in testing mode). In the training mode, the requirement is to find the optimum linear function weights (w in Equation 19) that maximize the success rate of the classifier. The success rate is represented here by the conditional probability P(D/w), where D=(($F_{c,1}, y_1$) ... ($F_{c,n}, y_n$)) is a matrix that contains the training data for n measurements, and $y_i$ is the fault label for each measurement. This conditional probability P(D/w) is defined further in Equation (20):

$$P(D|w) = \prod_{i=1}^{n} p(y_i | F_{c,i}, w) = \prod_{i=1}^{n} \alpha_i^{y_i} (1 - \alpha_i)^{1 - y_i} \quad (20)$$

After the training is done and the optimum value of w is found, any new fault signature similarity with a known fault signature can be tested by calculating Equation (19) using the w and the new fault signature values ($F_{c,i}$) which will result in a percentage that represents the similarity between the new fault signature and a known fault signature. The full process of training the classifier and testing new fault signatures is described in a flow chart in FIG. 22 with reference to the relevant equations described above.

Figure 22:
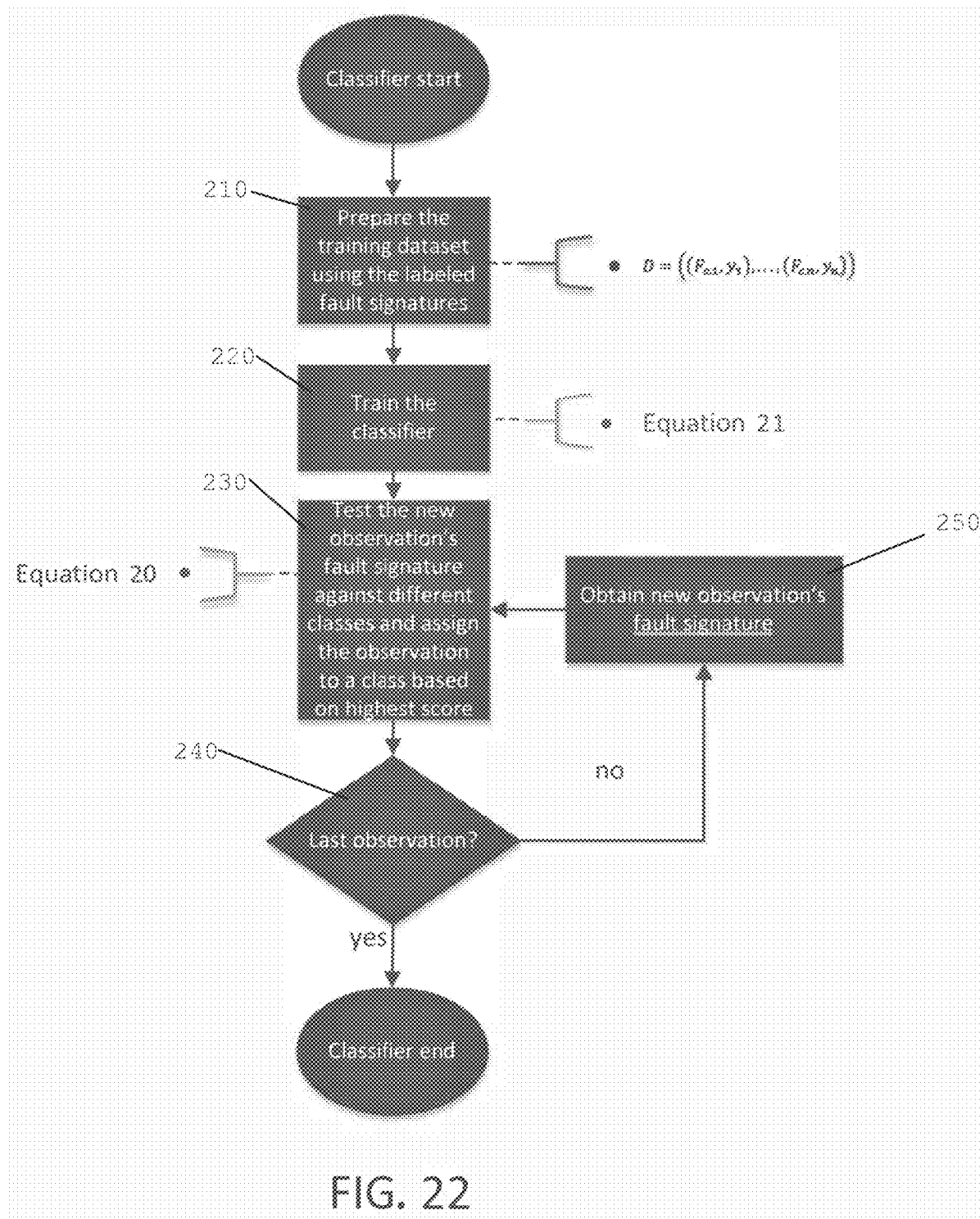
FIG. 22 is a flowchart detailing the steps in a method using a logistic discriminant classifier according to one aspect of the present invention.
Figure 23:
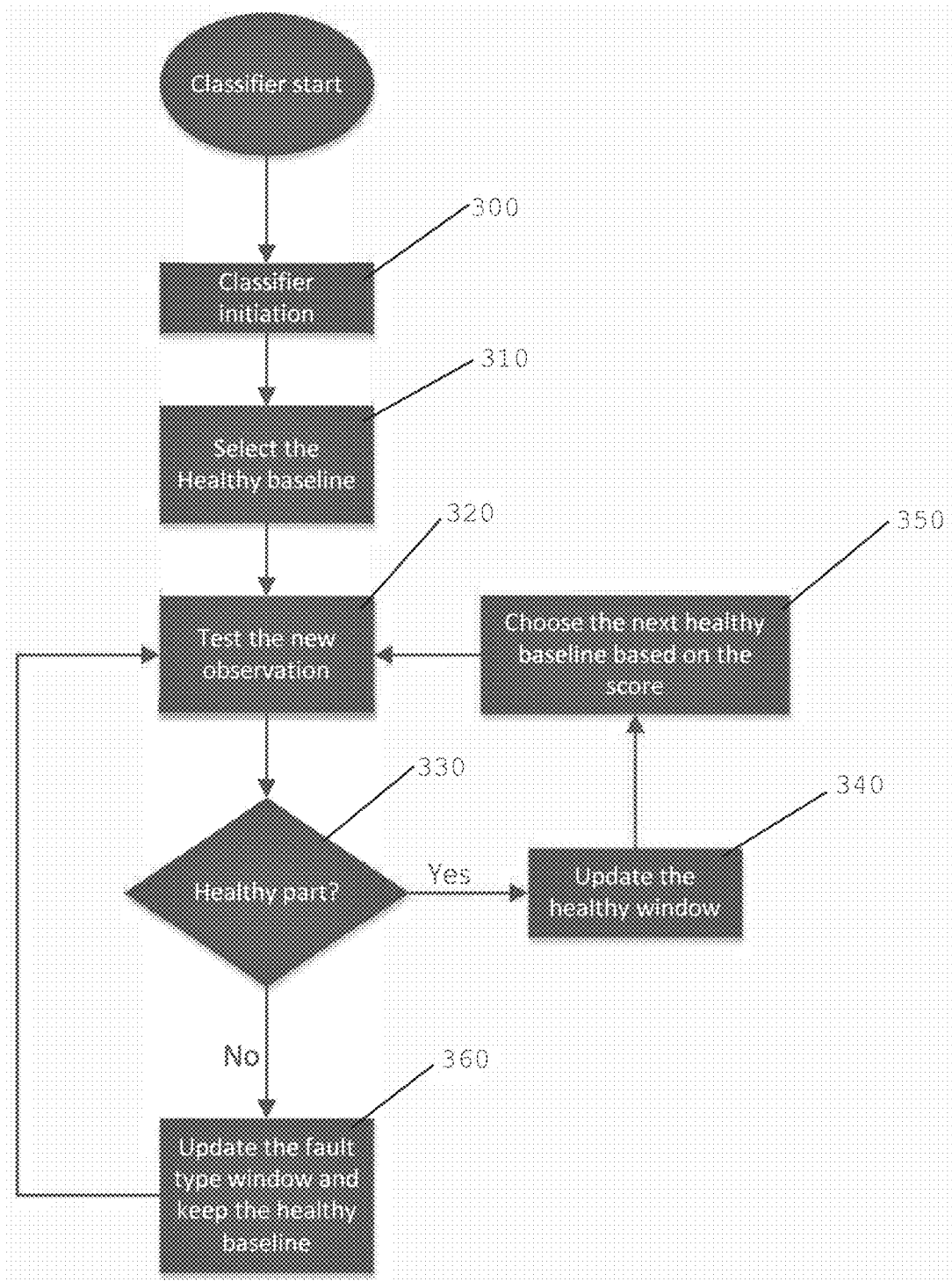
FIG. 23 is a flowchart detailing the steps in a method using a dynamic classifier according to another aspect of the present invention.

The method illustrated in FIG. 22 begins with the preparation of the training dataset with labeled fault signatures (step 210). The classifier is then trained (step 220) and, once this is done, a new observation's fault signature can be tested. This is done (step 230) against different classes and the new observation is assigned or classified to a class based on the highest similarity score. If the new observation is the last, then the classifier method ends (step 240). Otherwise, the logic loops with obtaining another new observation (step 250) and this is tested against the known classes of faults (step 230).

Figure 24:
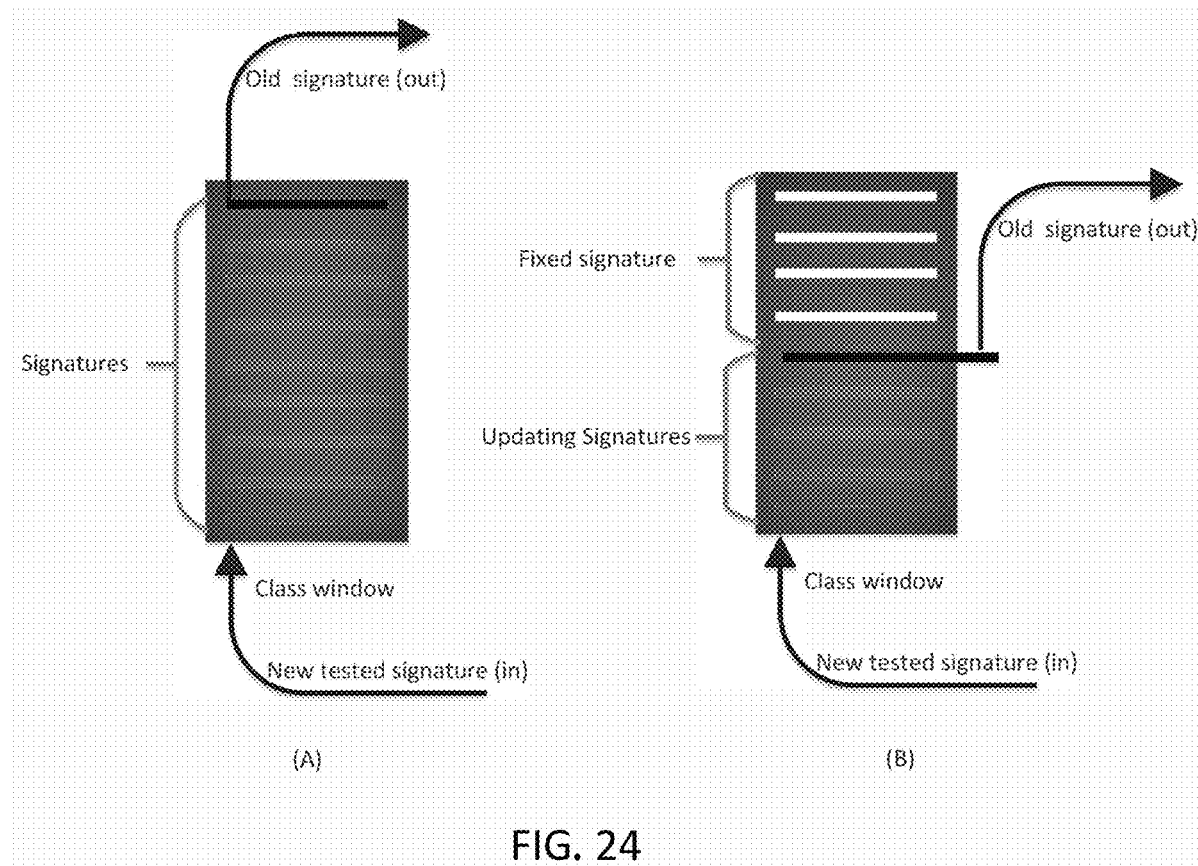
FIG. 24 schematically illustrates a class window updating scheme using a FIFO sequencing where all the window are updated (left side) and where only half of the window is updated (right side)

While the classifier in this setup gives very good results, it does not account for the variations of fault signatures for the same fault in the long run. In other words, the current classifier always compares a new signature against the initial fault signatures that the classifier was trained on. This is not an ideal setup as industrial environments tend to introduce meandering, random effects or outliers (unrelated to faults) which might manifest in the sensor measurements. These effects or random variables may change in a manufacturing environment. An example that has been known to cause random variation is humidity, which might slowly affect sound measurements. Preferably, the classifier is dynamic enough to allow a small and meandering bias in the manufacturing system to occur, as long as that bias is consistent with all measurements. This dynamic effect is introduced by retraining the classifier in a systematic way. An overview of such a retraining model is defined in FIG. 24. From FIG. 24, the steps of the model are as follows:

the classifier with the labeled training dataset is initiated and trained (step 300);

the classifier runs over all healthy signatures in the training dataset and the measurement that achieves the highest score is selected as the new baseline (step 310);

new observation measurements are obtained and its fault signature is found (not shown);

the classifier runs on that fault signature (step 320);

if the classifier found the new signature to be healthy (step 330) then one healthy signature in the healthy training dataset (healthy window) is replaced with the new signature (step 340) in First Input First Output (FIFO) manner (see left side of FIG. 24). Then the classifier is retrained again (to find the new optimal w in Equation 19). Afterwards the classifier runs again on all healthy signatures to reselect the highest score healthy measurement (step 350), which is considered the center of the healthy signatures population.

If the new signature is not healthy (step 330), then the training dataset (fault window) of the related fault (a bearing fault for example) is updated in FIFO manner (step 360);

new measurements are obtained and the previous steps are repeated.

The above method will allow the training dataset to change with time continuously. It should, however, be noted that, when the dynamic classifier updates the healthy dataset it selects a new baseline for the next observation test. To select the best baseline, the classifier compares all the healthy training window measurements and then selects the highest classification score (based on the function $\sigma(w^T F_{c,i})$) as the new baseline. This assures that the new baseline is the center of the complete healthy population and consequently increases FDD accuracy.

It should also be noted that the dynamic classifier described above is the first version of three versions of dynamic classifiers which may be used with the present invention.

The second version varies of a dynamic classifier from the first only in the updating frequency. Instead of retraining the classifier each time a new fault signature is classified, the classifier is updated only after testing k new fault signatures. This change in the updating frequency reduces computational cost and analysis time.

The third variation of the dynamic classifier is concerned with the variation of fault signature space per fault. As in the first two versions, the whole initial training dataset (fault signatures) is updated with time based on classifier results. An error could therefore accumulate in the dataset which reduces the overall performance of the whole FDD system. The third version introduces a parameter γ which represents a fraction of the training dataset. The γ percentage is the only portion of the dataset that is continuously updated, with the rest of the initial dataset remaining the same in every retraining process. The updating process uses a FIFO sequencing for the replacement of signatures in the dataset (see right side of FIG. 24). This concept restrains error accumulation and limits the variation from the initial training dataset. γ values vary from 0 to 1 and, where (γ=0), this disables the dynamic update feature and forces the classifier to use only the initial set of fault signatures. When (γ=1), this allows the classifier to update the whole dataset with new fault signatures.

Figure 25:
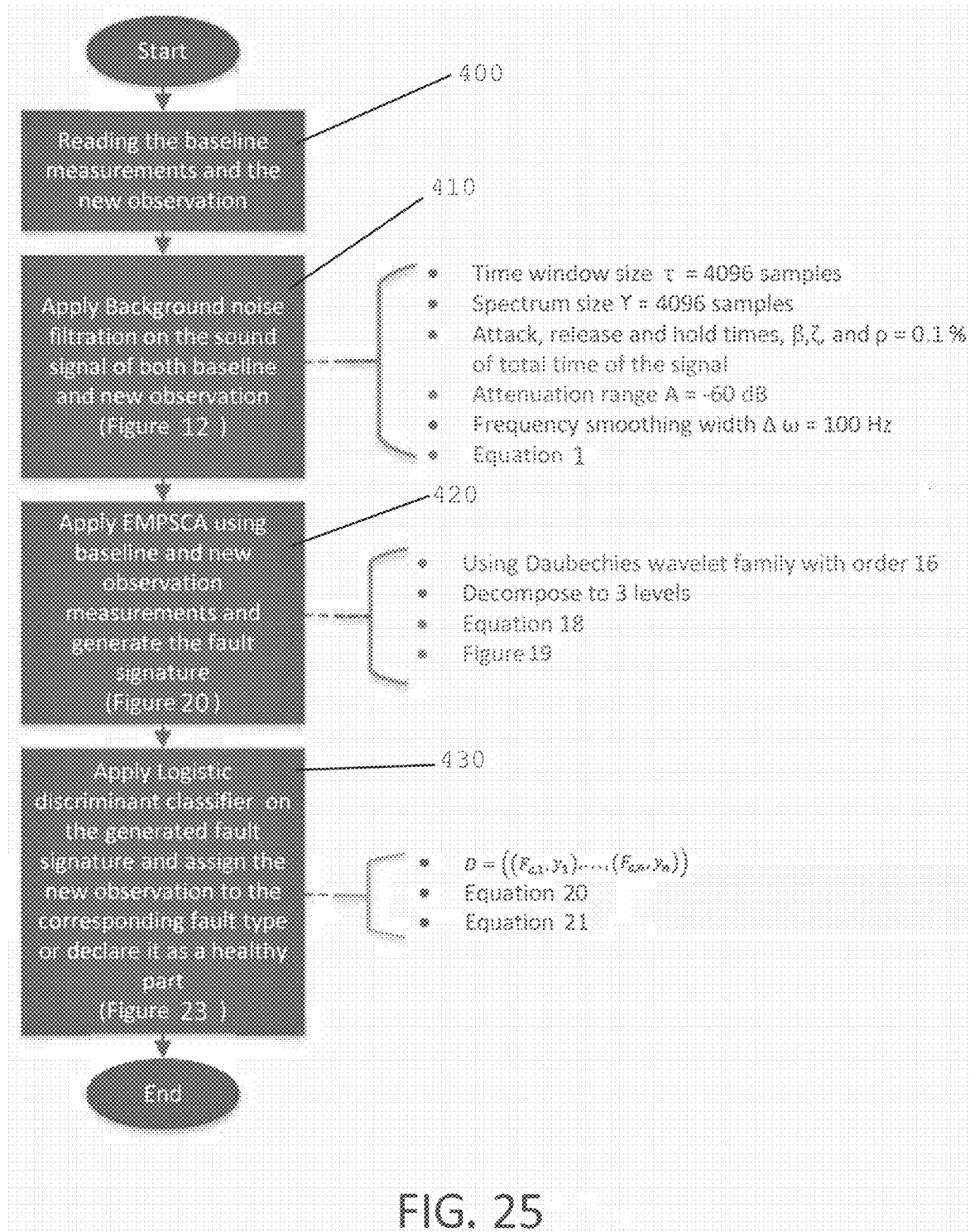
FIG. 25 is a flowchart detailing the steps in a method according to yet another aspect of the present invention.

The classifier step or module is an end step of the system or method (also known as IEMSPCA). The method of the present invention can be generalized into the following steps as detailed in FIG. 25:

Step 400: New raw measurements are obtained with the test measurement data possibly being received from sensors. This step may include reading stored baseline measurements from system memory.

Step 410: Background noise is filtered out of the measurement data signal. This step may also include filtering out background noise from the baseline measurements.

Step 420: An enhanced PCA analysis is applied to the data to generate the fault signature for the new measurements. This step includes using WPT to decompose the measure signals, applying PCA to the resulting data, and applying the new statistical index $F_{c,i}$ for fault detection. This step may also involve normalizing the data signal prior to applying a wavelet transform and prior to the PCA analysis.

Step 430: Fault signatures are classified. This step may involve assigning the generated fault signature to a known or new fault type or declaring the signature as indicating a healthy result.

It should be noted that the system and method of the invention may be seen to have the following characteristics:
(1) the system is designed for industrial applications, therefore the FDD method is fast and efficient, it works accurately in noisy environments, and it is very easy to use,
(2) the FDD performance is boosted by selecting the right methods and connecting these methods seamlessly. The specific configuration outlined in this document outperforms most of the other FDD systems in terms of performance, where performance is measured by the consumed analysis time and the FDD result accuracy.
(3) the system of the invention is scalable to a theoretically unlimited number of sensors for providing the input data measurements, besides being able to work on a variety of physical measurements since this system is signal-based and, as such, minimal to no development is needed to apply the technology to other applications.

The present invention may therefore be used in the fields listed below. Such a list is non-limiting and the present invention may also be used in other fields not listed below:
Electric motors fault detection and diagnosis
Automotive starters fault detection and diagnosis
Automotive alternators fault detection and diagnosis
Internal Combustion engines fault detection and diagnosis
Gearboxes fault detection and diagnosis
Electrical generators fault detection and diagnosis In one aspect, the fault detection and diagnosis (FDD) system can use any number of multiple sensors for signal input to the FDD system. These inputs are the data source relating to the machine or the mechanical system(s) being monitored. The system also uses a background noise filtration subsystem that is used to isolate background noise that is inevitable in manufacturing and machine operation environments. Furthermore, the system uses a fault detection and diagnosis subsystem or module. This subsystem or module is the core of the overall system and it is responsible for detecting and isolating faults. Fault signatures are generated as an output that reflects the fault component in the measurements. The system also uses a classifier that matches the fault signature output from the fault detection and diagnosis subsystem or module to one of the faults in a fault library. This classifier translates the fault signature into a readable output for the user that describes existing faults.

The present invention is applicable for use on mechanical, electrical, and other physical measurements.

A noise gating technique may be used for background noise filtration. This technique may include features such as a look-ahead feature, an attack time feature, a release time feature, a hold time feature, as well as a hysteresis feature. The noise gating technique allows for the filtering out of noise from different physical measurements such as sound and vibration signals. In one implementation, the noise gating technique filters out noise from signals by comparing the frequency content of the measured signals with the frequency content of noise samples of similar measurement types. A noise sample for each measurement can be acquired by a separate dedicated sensor or, for a machine monitoring application, the sample can be acquired from the main sensors by collecting the background noise when the machine being monitored is not operational.

For the actual fault detection and diagnosis, the system may use wavelet analysis, PCA analyses as well as a statistical index $F_c$. It should be noted that the system is not limited to using wavelets for time/frequency analysis as other analysis methods such as Short Time Fourier Transform (STFT) might be used as well. The system detects faults and generates the fault signature based on comparing test measurements with baseline measurements.

In one exemplary implementation, the system uses a Wavelet Packet Transform (WPT) to perform the wavelets analysis. Preferably, raw data is normalized before WPT is applied to the data. For this normalization, baseline mean and variance values are used for normalizing both the baseline and the test measurements. In this implementation, the coefficients of each atom from WPT are up-scaled using the corresponding wavelet filter inverse before using these coefficients as inputs to PCA analysis. After up-scaling, PCA is then applied on the up-scaled coefficient of wavelets atoms at each frequency level of the wavelet decomposition. Since the raw data was already normalized, PCA analysis is used without any traditional normalization techniques.

For this implementation, the fault signature is found by calculating the statistical index $F_c$ using the covariance of Principal Components scores T=XP. This fault signature shows the fault components in the measurements decomposed to different frequency levels for each measured signal. This fault is of a unique per fault type. The constructed fault signature is used as an input to the classifier that translates the fault signature into a readable output form to the user.

In this implementation, the classifier used is the logistic discriminant classifier. However, it should be noted that the system is not limited to using a logistic discriminant classifier as the classifying method. Other classifiers might be used as well. For this classifier, training is accomplished by using a dataset that consists of fault signatures ($F_c$) and their corresponding labels which describes the machine status (e.g. "healthy" or the fault name such as "ball bearing"). The classifier's training process is accomplished by finding the optimal classifier weights that maximize the success rates of diagnosing the faults.

The weights used in the classifier (i.e. the classifier weights) may be initialized using Fischer Linear Discriminant (FLD) analysis. These weights can then converge into the exact weights using the logistic discriminant classifier. This procedure is faster than finding the optimal weights solely using a logistic discriminant classifier.

For this implementation, the logistic discriminant classifier used is a multiple binary classifier with one for each machine condition.

In this system, whenever a new measurements set is collected, the fault signature is generated using the system's components. The similarity of the generated fault signature to one of a known set of fault signatures is measured by the logistic discriminant classifier. This comparison results in a percentage of similarity between the generated fault signature with the known fault signatures.

It should be noted that the logistic discriminant classifier can be used in static or dynamic mode. In static mode, the classifier takes the form of the standard logistic discriminant classifier with its weights being initialized using Fischer Linear Discriminant (FLD) analysis.

In dynamic mode, the logistic discriminant classifier may have three different versions. The first dynamic mode version of the logistic discriminant classifier is the same as the static mode but with the addition of an introduced dynamic classification feature. This feature defines a framework where the classifier is continuously trained using the new data which extends the classifier's capability and allows it to cope with small consistent changes in manufacturing environments. The second dynamic mode of logistic discriminant classifier is similar to the first dynamic mode but with the addition of an update frequency feature. This update frequency feature allows the classifier to be retrained after a user defined number of tests instead of being updating after every test. The third dynamic mode of logistic discriminant classifier is similar to the second mode but with the addition of a dynamic window fraction parameter. This parameter allows for the control of the dynamic and static fractions of the training dataset. This parameter controls the classifier's adaptability to changes in the manufacturing environments.

The system can thus be viewed as a signal based fault detection and diagnosis (FDD) tool. The FDD method (IEMSPCA) is able to detect faults and to automatically diagnose these faults without human interaction. The system and the method are designed to be used in industrial End-Of-Line testers as well as for monitoring machinery health conditions while the machinery is in operation. This signal based Fault Detection and Diagnosis (FDD) tool allows it to work on a wide spectrum of physical measurements types (e.g. voltage, sound, vibration). The method has three main parts, including but not limited to:
1) the filtration of background noise,
2) the detection and extraction of the fault, and
3) the automatic classification of fault(s) detected.

For a better understanding of the above described invention, reference may be made to the following documents, all of which are hereby incorporated by reference:

[1] N. Sawalhi, R. Randall and H. Endo, "The enhancement of fault detection and diagnosis in rolling element bearings using minimum entropy deconvolution combined with spectral kurtosis", (Mechanical Systems and Signal Processing, 2007)

[2] P. Paajarvi and J. P. Leblanc, "Method for rolling bearing fault detection based on enhancing statistical asymmetry", (2011)

[3] M. A. Purdy, "Adjusting weighting of a parameter relating to fault detection based on a detected fault", (2014)

[4] P. Dutta, G. C. Keong, S. Nadarajan, F. Yang, X. Zhao and K. Shyh-hao, "Asset condition monitoring", (2018)

[5] H. Yang, J. Mathew and L. Ma, "Vibration feature extraction techniques for fault diagnosis of rotating machinery: a literature survey", (2003)

[6] V. Ghorbanian and J. Faiz, "A survey on time and frequency characteristics of induction motors with broken rotor bars in line-start and inverter-fed modes", (Mechanical Systems and Signal Processing, 2015)

[7] M. J. Devaney and L. Eren, "Motor bearing damage detection via wavelet analysis of the starting current transient", (2004)

[8] B. R. Bakshi, "Multiscale PCA with application to multivariate statistical process monitoring", (Aiche Journal, 1998)

[9] H. Bendjama, M. S. Boucherit and S. Bouhouche, "FAULT DIAGNOSIS OF ROTATING MACHINERY USING WAVELET TRANSFORM AND PRINCIPAL COMPONENT ANALYSIS", (Proceeding of the International Arab Conference on Information Technology (ACIT), 2010)

[10] S. R. Haqshenas, "Multiresolution-Multivariate Analysis of Vibration Signals; Application in Fault Diagnosis of Internal Combustion Engines", (2013)

[11] S. F. Boll, "Suppression of acoustic noise in speech using spectral subtraction", (Acoustics, Speech and Signal Processing, IEEE Transactions on, 1979)

[12] J. S. Lim and A. V. Oppenheim, "Enhancement and bandwidth compression of noisy speech", (Proceedings of the IEEE, 1979)

[13] J. Hodgson, "Understanding Records: A Field Guide to Recording Practice", (Bloomsbury Publishing, 2010)

[14] R. Martinek, L. Klein and P. Marek, "Novel signal gate solution suitable for implementation in audio and recording technologies", (2012)

The above described invention may be practiced by implementing the various stages as either integrated or separate software modules with each module performing the functions described for each stage. Thus, a filter module may perform the function of filtering background noise from data signals, a PCA analysis module may conduct PCA analysis of filtered modules produced by the filter module, and a classifier module may classify the fault signatures produced by the PCA analysis module. Similarly, a normalization module may normalize the filtered signals from the filtered module.

It should be noted that the systems, methods, and modules according to the present invention may be implemented using multiple methods. The present invention may be implemented using ASIC (application specific integrated circuit) technology or it may be implemented such that each block, stage, or module is implemented separately from the other blocks, stages, or modules. Similarly, the present invention may be implemented using any suitable data processing device including a general data processor such as a general purpose computer. Alternatively, the present invention may be implemented using a dedicated data processing device specific for the use of the present invention.

The embodiments of the invention may be executed by a computer processor or similar device programmed in the manner of method steps, or may be executed by an electronic system which is provided with means for executing these steps. Similarly, an electronic memory means such as computer diskettes, CD-ROMs, Random Access Memory (RAM), Read Only Memory (ROM) or similar computer software storage media known in the art, may be programmed to execute such method steps. As well, electronic signals representing these method steps may also be transmitted via a communication network.

Embodiments of the invention may be implemented in any conventional computer programming language. For example, preferred embodiments may be implemented in a procedural programming language (e.g. "C") or an object-oriented language (e.g. "C++", "java", "PHP", "PYTHON" or "C#"). Alternative embodiments of the invention may be implemented as pre-programmed hardware elements, other related components, or as a combination of hardware and software components.

Embodiments can be implemented as a computer program product for use with a computer system. Such implementations may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or electrical communications lines) or a medium implemented with wireless techniques (e.g., microwave, infrared or other transmission techniques). The series of computer instructions embodies all or part of the functionality previously described herein. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink-wrapped software), preloaded with a computer system (e.g., on system ROM or fixed disk), or distributed from a server over a network (e.g., the Internet or World Wide Web). Of course, some embodiments of the invention may be implemented as a combination of both software (e.g., a computer program product) and hardware. Still other embodiments of the invention may be implemented as entirely hardware, or entirely software (e.g., a computer program product).

A person understanding this invention may now conceive of alternative structures and embodiments or variations of the above all of which are intended to fall within the scope of the invention as defined in the claims that follow.

We claim:

1. A system for analyzing faults in a machine, the system comprising:
    at least one sensor coupled to said machine, said at least one sensor being for measuring at least one physical value potentially related to said faults, wherein said at least one sensor produces data signals based on said at least one physical value; and
    a processor configured for:
        filtering background noise from said data signals to thereby produce filtered signals;
        conducting Principal Components Analysis (PCA) on said filtered signals using a wavelet packet transform (WPT), to thereby produce fault results;
        processing said fault results to produce fault signatures that describe which data signals contain faults; and
        classifying said fault signatures;
    such that results of said classifying provide information related to said faults;
    wherein said system is used in End of Line testing of machinery;
    wherein said processor is further configured for isolating signals containing faults using at least one statistical index that represents fault components in different frequency levels and that describes which input signal contains faults.

2. The system according to claim 1, wherein said processor is further configured for normalizing filtered signals prior to conducting Principal Components Analysis on said filtered signals.

3. The system according to claim 2, wherein said processor normalizes said filtered signals using a baseline signal's mean value and variances.

4. The system according to claim 3, wherein said filtered signals are normalized before said wavelet packet transform is used on said filtered signals.

5. The system according to claim 1, wherein said processor is configured for retraining to detect fault results whenever a new fault signature is detected.

6. The system according to claim 1, wherein said processor is configured for retraining to detect fault results whenever a predetermined number of new fault signatures has been detected.

7. The system according to claim 1, wherein said processor is configured for retraining to detect fault results whenever a predetermined condition is met, and wherein, when said processor is retrained, only a portion of a training dataset is continuously updated.

8. The system according to claim 1, wherein said processor, when filtering, uses a noise gating method to detect and remove background noise from said data signals.

9. The system according to claim 8, wherein said processor, when filtering, uses at least one of:
    a feature for avoiding sudden jumps or clicks in said filtered signals;
    a hold time feature for holding a noise gate open for a certain time after a signal level falls below a predefined threshold;
    an upper level value for said predefined threshold;
    a lower level value for said predefined threshold; and
    a look-ahead function for opening said noise gate ahead of time to capture sudden events in said data signals.

10. The system according to claim 8, wherein said noise gating method comprises:

a) obtaining a noise profile sample;
b) splitting said noise profile sample into small time domain windows;
c) calculating a spectrum of each small time domain window;
d) at each frequency, determining a maximum level for different noise windows, said maximum level being a threshold level for said frequency;
e) obtaining a sample signal and splitting said sample signal into segments, each segment having a size equal to a size for said small time domain windows; and
f) at each frequency of said sample signal, determining said sample signal's spectrum and comparing said sample signal's spectrum with the threshold level for said frequency.

11. The system according to claim 1, wherein said at least one statistical index comprises said fault signature $F_{c,j}$ defined as $$F_{c,j} = \text{sign}(L_j) \circ \sqrt{|L_j|}$$

wherein, $$L_j = \sum_{i=1}^{m} \text{sign}(COV(F))_j \circ [COV(F) \circ COV(F)]_j$$

and wherein c, i, j, and m are index values and F is a faults component of said data signals.

12. The system according to claim 11, wherein said fault signature is used to classify said fault results.

13. The system according to claim 1, wherein said machine comprises at least one component manufactured at a manufacturing plant such that manufacturing faults in said at least one component are detected by said system.

14. The system according to claim 1, wherein said machine comprises machinery such that a maintenance condition of said machinery is monitored by said system.

15. The system according to claim 1, wherein said Principal Components Analysis uses WPT to decompose said filtered signals into different frequencies.

16. The system according to claim 1, wherein said classifying uses a logistic discriminant classifier.

17. A method for analyzing faults in a machine, the method comprising:
a) receiving data signals from at least one sensor coupled to said machine, wherein said at least one sensor measures at least one physical value potentially related to said faults and wherein said data signals are based on said at least one physical value;
b) filtering background noise from said data signals to thereby produce filtered signals;
c) conducting Principal Components Analysis (PCA) on said filtered signals to thereby produce fault results;
d) processing said fault results to produce fault signatures that describe which data signals contain faults; and
e) classifying said fault signatures, such that results of said classifying provide information related to said faults,
wherein said filtered signals are normalized prior to step c) and wherein said Principal Components Analysis (PCA) on said filtered signals is executed using a wavelet packet transform (WPT); and
wherein said method is executed for End of Line testing of machinery;
wherein signals containing faults are isolated using at least one statistical index that represents fault components in different frequency levels and that describes which input signal contains faults.

18. The method according to claim 17, wherein step b) is accomplished using a noise gating method.

19. The method according to claim 17, wherein said filtered signals are normalized using a baseline signal's mean value and variances.

* * * * *